US 7,742,378 B2

(12) United States Patent
Waldman et al.

(10) Patent No.: US 7,742,378 B2
(45) Date of Patent: Jun. 22, 2010

(54) METHOD AND APPARATUS FOR AZIMUTHAL HOLOGRAPHIC MULTIPLEXING USING ELLIPTICAL REFLECTOR

(75) Inventors: David A. Waldman, Concord, MA (US); Christopher J. Butler, Arlington, MA (US); Daniel H. Raguin, Acton, MA (US)

(73) Assignee: STX Aprilis, Inc., Maynard, MA (US)

( * ) Notice: Subject to any disclaimer, the term of this patent is extended or adjusted under 35 U.S.C. 154(b) by 824 days.

(21) Appl. No.: 10/761,142

(22) Filed: Jan. 20, 2004

(65) Prior Publication Data

US 2004/0223200 A1 Nov. 11, 2004

Related U.S. Application Data

(60) Provisional application No. 60/441,122, filed on Jan. 21, 2003.

(51) Int. Cl.
*G11B 7/00* (2006.01)
(52) U.S. Cl. .................................. 369/103; 369/112.29
(58) Field of Classification Search ................. 369/103, 369/112.23, 112.03, 112.29
See application file for complete search history.

(56) References Cited

U.S. PATENT DOCUMENTS

| 3,615,123 A | 10/1971 | Wuerker |
| 5,481,523 A | 1/1996 | Dewald |
| 5,483,365 A | 1/1996 | Pu et al. |
| 5,566,387 A * | 10/1996 | Dewald ....................... 369/103 |
| 5,638,193 A | 6/1997 | Trisnadi et al. |
| 6,080,965 A | 6/2000 | Osawa |
| 6,157,473 A | 12/2000 | Jang et al. |
| 6,639,652 B1 | 10/2003 | Mori et al. |
| 6,700,686 B2 * | 3/2004 | King et al. ..................... 359/11 |
| 2003/0053232 A1 * | 3/2003 | Dalziel ....................... 359/877 |
| 2003/0072045 A1 | 4/2003 | King et al. |

FOREIGN PATENT DOCUMENTS

| EP | 1 065 658 A1 | 1/2001 |
| JP | 09-179194 | 7/1997 |

(Continued)

OTHER PUBLICATIONS

Jang, Ju-Seog et al., "Holographic Data Storage by Combined Use of Peristrophic, Angular, and Spatial Multiplexing," Optical Engineering, 39(11); 2975-2981 (2000).*

(Continued)

*Primary Examiner*—Wayne R Young
*Assistant Examiner*—LaTanya Bibbins
(74) *Attorney, Agent, or Firm*—Hamilton, Brook, Smith & Reynolds, P.C.

(57) ABSTRACT

A method and an apparatus for recording at least two multiplexed holograms. Either an object beam or a reference beam is reflected from an aspherical reflecting surface. Either the reference beam impinging on a recording media at the selected storage location or the object beam impinging on the recording media at the selected storage location is rotated through a selected azimuthal angle about an axis that passes through a plane defined by the intersection of the object beam and the reference beam in the recording media, wherein an angle between the object beam and the reference beam impinging on the recording media is preserved.

84 Claims, 10 Drawing Sheets

FOREIGN PATENT DOCUMENTS

| | | |
|---|---|---|
| JP | 11-097370 | 4/1999 |
| JP | 11-311936 | 11/1999 |
| JP | 2000-338846 | 12/2000 |
| JP | 2000-353418 | 12/2000 |

OTHER PUBLICATIONS

Pu, Allen, and Psaltis, Demetri, "High-Density Recording in Photopolymer-Based Holographic Three-Dimensional Disks," *Applied Optics*, 35(14): 2389-2398 (1996).

Waldman, D.A., et al., "Holographic Recording Properties in Thick Films of ULSH-500 Photopolymer," *SPIE*, 3291: 89-103 (1998).

Jang, Ju-Seog, et al., "Holographic Data Storage by Combined Use of Peristrophic, Angular, and Spatial Multiplexing," *Optical Engineering*, 39(11): 2975-2981 (2000).

Waldman, D.A., et al., "CROP Holographic Storage Media for Optical Data Storage at Greater Than 100 Bits/$\mu m^2$," *Proceedings of SPIE*, 5216: 10-25 (2003).

Curtis, K., et al., "Method for Holographic Storage Using Peristrophic Multiplexing", *Optics Letters*, 19(13):993-994 (1994).

Notification of Reason(s) for Rejection dated Dec. 8, 2009 for Japanese Application No. 2006-501043 (English translation included).

\* cited by examiner

METHOD AND APPARATUS FOR AZIMUTHAL HOLOGRAPHIC MULTIPLEXING USING ELLIPTICAL REFLECTOR

RELATED APPLICATION

This application claims the benefit of U.S. Provisional Application No. 60/441,122, filed on Jan. 21, 2003. The entire teachings of the above application are incorporated herein by reference.

BACKGROUND OF THE INVENTION

One important potential use of volume holograms is in digital data storage; the three dimensional nature of a volume hologram, which refers to the storage of each bit as a hologram extending throughout the volume of the recording medium, renders volume holograms suitable for use in high capacity digital data storage. A group of bits can be encoded and decoded together as a two dimensional array of bits referred to as a page. Various multiplexing methods, such as angular, spatioangular, shift, wavelength, phase-code, and related methods, are used to store multiple pages co-locationally within the same volume or in partially overlapping volumes.

The use of peristrophic or azimuthal multiplexing for recording data page holograms in recording media of moderate thickness is an effective method for increasing the accessible angular bandwidth (see Curtis, et al. Optics Letters, 19, 13, pp 993-994 (1994). With this method, the reconstructed image of all unselected holograms can be rotated completely off the field of view of a detector, while reconstruction of only the selected hologram is imaged onto the detector image plane. In this manner the reconstructed holograms are spatially separated in the image plane. Typically, a CCD or CMOS detector is used.

The rotation, $d\phi$, required for the spatial separation for Fourier plane holograms is approximately given by formula (1) (see Curtis, et al. Optics Letters, 19, 13, 993 (1994))

$$d\phi \geq \frac{N\delta/F}{\sin\theta_{ref} + \sin\theta_{obj}} \quad (1)$$

where N is the number of pixels per side of the detector, $\delta$ is the pixel pitch, F is the focal length of the lens, and $\theta_{ref}$ and $\theta_{obj}$ are the incident angles of the reference and object beams, respectively, with respect to a normal to the surface of the recording media. For image plane holograms, the rotation, $d\phi$, required for the spatial separation is substantially smaller and is given by formula (2) (see Curtis, et al. Optics Letters, 19, 13, 993 (1994)):

$$d\phi \geq \frac{2\lambda/\delta}{\sin\theta_{ref} + \sin\theta_{obj}} \quad (2)$$

where $\lambda$ is the wavelength of the imaging light and $\delta$ is the highest spatial frequency in the image.

There are generally three kinds of noise in any holographic data storage system: inter-page and intra-page, and effects due to scattered light from the recording medium. Inter-page noise occurs when light from a data page is diffracted while a different data page is being read out. Intra-page noise is due to light from a pixel contributing to the intensity of another pixel within the same data page that is being read out. Intra-page includes the effects of ordinary diffraction and aberrations, but it can also have other origins such as from ghost reconstructions inherent in speckle multiplexing. The nature and quantity of inter-page and intra-page noise depend on the multiplexing method and the imaging system used to record and reconstruct the data pages.

In angle multiplexing, Bragg mismatch is the mechanism that defines which page is read out at a given position of the reference beam. The angle of incidence of the plane-wave reference beam of a given hologram must therefore deviate by more than the Bragg angle selectivity $\Delta\theta$ from the angle of incidence of reference beams of other holograms multiplexed in the same medium. The quantity $\Delta\theta$ depends on the orientation of the grating vector (i.e., the orientation and spacing of the interference fringes which form the hologram) and the thickness of the holographic medium. Consequently, different pixels within the same data page have different $\Delta\theta$'s because they correspond to slightly different fringe patterns on the hologram. When a different data page is being read out, pixels from other data pages are Bragg mismatched by different amounts. Accordingly, it is impossible to place all pixels of a single data page onto the Bragg null of another data page. This results in inter-page crosstalk noise. (Intra-page noise in the case of angle multiplexing results from diffraction and aberrations.) However, when the reconstructed holograms are spatially separated in the image plane using azimuthal multiplexing, the degree of inter-page crosstalk is reduced from that observed in angle multiplexing. In the undepleted reference beam approximation, which is typically the case when multiplexing many holograms, simultaneous diffraction from a portion of the azimuthal multiplexed holograms can occur. However, this does not impact the signal-to-noise ratio (SNR) of any individual hologram, as the loss in signal is negligible. One approach to reduce cross-talk between recorded images, while keeping the storage density of holographically recorded images constant is to use thicker recording media and record holograms with either angular or planar multiplexing. However, volume scatter increases with thickness and thus the attainable dynamic range of the material is degraded.

An attractive approach to increasing information density is combining angle and azimuthal multiplexing. This combination is effected by rotating the Bragg plane incrementally through about 180° during recording for a particular inter-beam angle, defined as the angle between the incident object (signal) and reference beams. This method is particularly effective in achieving the maximum angular bandwidth of the optical system. In this manner, Bragg selectivity from angle multiplexing can be combined with Bragg plane rotation for a particular interbeam angle. This type of combined multiplexing also changes a limiting factor for achieving increased information storage density from that limited by angular bandwidth to that limited by the dynamic range of the recording material. Finally, the combined multiplexing method can be further combined with spatial multiplexing by movement of the recording medium.

Previously described implementations of azimuthal multiplexing, or combination of angle and azimuthal multiplexing employ rotation of the recording material about the optical axis of the object beam, or rotation of the object beam and the reference beam, or rotation of the reference beam that is a part of a co-axial type imaging geometry for the object and reference beams in that the reference beam is concentrically disposed about the object beam. The latter implementation comprises a lens system that includes an inner field for the object beam and an outer annular field for the reference beam. Typically, these embodiments would require that the numerical aperture (NA) of the lens delivering the reference beam be about twice the value necessary for the lens delivering the object beam. These implementations are technologically complex, difficult to produce and consequentially costly and unsuitable for mass production.

Accordingly, the need exists for a compact, technologically simple and inexpensive design of a read/write combined multiplexing device, such as an optical pickup head, that operates to achieve high storage density and is suitable for use in a mass-produced holographic drive.

SUMMARY OF THE INVENTION

This invention relates to a method and apparatus for recording and reading multiplexed digital page based holograms.

In one embodiment, the invention is a method of recording at least two multiplexed holograms. The method comprises the steps of reflecting either an object beam or a reference beam from at least one portion of a first aspherical reflecting surface and rotating at least one of a portion of the reference beam impinging on a recording media at the selected storage location and a portion of the object beam impinging on the recording media at the selected storage location through a selected azimuthal angle about an axis that lies in the plane formed by optical axes of the portions of the object beam and the reference beam impinging on the recording media while preserving an angle between optical paths of the portions of the object beam and the reference beam impinging on the recording media. The axis of rotation passes through the selected storage location. The object beam and the reference beam can be generated by a coherent light source. The object beam and the reference beam intersect and form an interference pattern at the selected storage location in a recording media, thereby recording a first and, after rotation, a second hologram at the selected storage location.

In another embodiment, the present invention is a method of recording azimuthally multiplexed holograms in an optical recording media, comprising the steps of (a) predetermining a series of azimuthal multiplexing angles $\{\phi_j\}$, wherein j is an integer; (b) selecting an angle $\phi_a$ wherein a is an integers and $\phi_a$ is selected from the series $\{\phi_j\}$; (c) directing an object beam and a reference beam that are mutually coherent at a selected data storage location situated along a selected track on the optical recording media; (d) repeating step (c) for a plurality of selected data storage locations, thereby recording a plurality of holograms, each at a selected storage location along the selected track on the optical recording media; and (e) repeating steps (c) through (d) for a different integer a, wherein the subsequent holograms are recorded in the selected track using the storage locations utilized by the previously recorded plurality of holograms. The reference beam is reflected from at least one portion of an aspherical mirror. During operation of this method, a portion of the reference beam impinging onto the recording media has an azimuthal angle (Pa with respect to an axis formed by an optical axis of a portion of the object beam impinging onto the recording media.

In another embodiment, the present invention is a method of recording azimuthally and angularly multiplexed holograms on an optical recording media, comprising the steps of (a) predetermining a series of planar multiplexing angles $\{\theta_i\}$, wherein i is an integer; (b) predetermining a series of azimuthal multiplexing angles $\{\phi_j\}$, wherein j is an integer; (c) selecting a pair of angles $(\theta_a,\phi_b)$ wherein a and b are integers and $\theta_a$ and $\phi_b$ are independently selected from the series $\{\theta_i\}$ and $\{\phi_j\}$, respectively; and (d) directing an object beam and a reference beam that are mutually coherent at a data storage location situated along a selected track on the optical recording media. During the operation of the method, the reference beam is reflected from at least one portion of an aspherical mirror, an angle between portions of the object beam and the reference beam impinging onto a recording media is $\theta_a$, and the portion of the reference beam impinging onto the recording media has an azimuthal angle $\phi_b$ with respect to an axis formed by an optical axis of a portion of the object beam impinging onto the recording media. The method further includes the steps of (e) repeating step (d) for a plurality of data storage locations along a selected track, thereby recording a plurality of holograms, each at a storage location along the selected track on the optical recording media and (f) repeating steps (c) through (e) for different integers a and b, wherein the subsequent holograms are recorded along the selected track using the storage location utilized by the previously recorded plurality holograms.

In another embodiment, the present invention is a method of reading azimuthally and angularly multiplexed holograms recorded in an optical recording media, comprising the steps of (a) predetermining at least one selected multiplexed hologram of a selected storage location along a selected track of recorded storage locations in an optical recording media; (b) predetermining at least one of a plurality of planar multiplexing angles $\{\theta_i\}$, wherein i is an integer, used to record said selected multiplexed hologram; (c) predetermining at least one of a plurality of azimuthal multiplexing angles $\{\phi_j\}$, wherein j is an integer, used to record said selected multiplexed hologram; (d) selecting a pair of angles $(\theta_a,\phi_b)$ wherein a and b are integers and $\theta_a$ and $\phi_b$ are selected from the series $\{\theta_i\}$ and $\{\phi_j\}$, respectively; (e) directing a reference beam at the selected data storage location, and (f) repeating step (e) for a plurality of selected multiplexed holograms previously recorded in data storage locations along at least one selected track for different integers a and b as may be necessary to read other selected multiplexed holograms, thereby reading a plurality of selected multiplexed holograms, each at a selected storage location along a track on the optical recording media. During the operation of the method, the reference beam is reflected from at least one portion of an aspherical mirror, the angle between a portion of the reference beam impinging on a recording media at the selected storage location and a portion of the object beam impinging on the recording media at said selected storage location is $\theta_a$, the portion of the reference beam impinging onto the recording media has an azimuthal angle $\phi_b$ with respect to an axis formed by the optical axis of the object beam used to record said selected multiplexed hologram, and reconstruction of the selected multiplexed hologram includes relaying a diffraction pattern from the multiplexed hologram with reconstruction optics to a detector.

In another embodiment, the present invention is an apparatus for recording holographically stored information comprising a recording media, at least one portion of an aspherical reflecting surface, at least one additional reflecting surface, a motive device for rotating at least one of either at least one portion of the aspherical reflecting surface or the at least one additional reflecting surface about a first axis and, independently, a second axis, perpendicular to the first axis, and means for directing an object beam and a reference beam that are mutually coherent along their respective optical paths. Either an object beam or a reference beam is reflected from at least one portion of the aspherical reflecting surface to intersect and form an interference pattern with the other at a storage location in the recording media.

In another embodiment, the invention is a method of reading azimuthally and angularly multiplexed holograms recorded in an optical recording media. The steps comprise (a) predetermining at least one selected multiplexed hologram of a selected storage location along a selected track of recorded storage locations in an optical recording media; (b) predetermining at least one of a plurality of azimuthal multiplexing angles $\{\phi_j\}$, wherein j is an integer, used to record said selected multiplexed hologram; (c) selecting a $\phi_a$ wherein a is an integer $\phi_a$ is selected from the series $\{\phi_j\}$; (d) directing a reference beam at the selected data storage location. The reference beam is reflected from at least one portion of an aspherical mirror, and the portion of the reference beam impinging onto the recording media has an azimuthal angle $\phi_a$ with respect to an axis formed by the optical axis of the object beam used to record said selected multiplexed hologram. Reconstructing of the selected multiplexed hologram includes relaying a diffraction pattern from the multiplexed hologram with reconstruction optics to a detector. Further steps include repeating step (d) for a plurality of selected multiplexed holograms previously recorded in data storage locations along at least one selected track for different integer a as may be necessary to read other selected multiplexed holograms, thereby reading a plurality of selected multiplexed holograms, each at a selected storage location along a track on the optical recording media.

In another embodiment, the present invention is an apparatus for reading and/or recording of holographically stored information comprising an optical recording media comprising information previously recorded as holograms, at least one portion of an aspherical reflecting surface, at least one additional reflecting surface, reconstruction optics for reconstructing at least one selected hologram, a detector for detecting the selected reconstructed hologram, a motive device for rotating at least one of either at least one portion of the aspherical reflecting surface or the at least one additional reflecting surface about a first axis and, independently, a second axis, perpendicular to the first axis, and a means for directing a reference beam along its optical path. The reference beam is reflected from at least one portion of the aspherical reflecting surface to impinge on at least one selected storage location in the recording media.

In another embodiment, the present invention is an information storage device comprising an optical recording media. The media includes a plurality of tracks, each track including a plurality of data storage locations, each location storing a plurality of holographically recorded images. Holographically recorded images stored in each storage location are both planar-angle-multiplexed and azimuthally multiplexed, and the data storage locations are non-overlapping and substantially abutting.

The method and apparatus of this invention can be advantageously incorporated into an optical pick up head in a compact design for a holographic drive system that records into and/or reads from holographic media such as a disk or card. In particular, in preferred embodiments, the apparatus of the present invention operates to record a plurality of azimuthally multiplexed images angularly separated by a range of angles totaling an arc of up to about 90°, preferably about 180°, more preferably about 270°, even more preferably 360°. In this manner the invention increases the multiplexing number over what can be achieved by planar-angle multiplexing.

The method and apparatus of this invention is advantageous for reducing contributions of inter-page cross talk to the Signal-to-Noise Ratio (SNR) of reconstructed holograms in systems where the optical assemblies are integrated into a optical drive. This has the effect of improving raw bit error rate (BER), the number of recorded errors in reconstructed holograms before correcting with means of error correction codes, and diminishing the amount of data overhead, such as required for implementation of error correction codes that is needed for a particular user information density.

The method and apparatus of this invention further provides for use of a co-axial type imaging geometry for the object and reference beams, but without requiring a lens system that comprises a field for the object beam and an outer annular field having high numeric aperture for the reference beam that surrounds and is concentric with the field of the object beam.

The invention is additionally advantageous for scheduling exposure times of multiplexed recordings in photopolymerizable recording media. Each pass along the track can preferably use just one exposure time for all recordings. Moreover, each hologram recorded can preferably have uniform recording sensitivity across the entire diameter of the data cylinder corresponding to each storage location of co-locational recording. By comparison, shift multiplexing or spatial multiplexing results in a grey scale of recording sensitivity exhibited between the leading edge of the advancing spot diameter along the track used for recording and the trailing edge of the spot.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
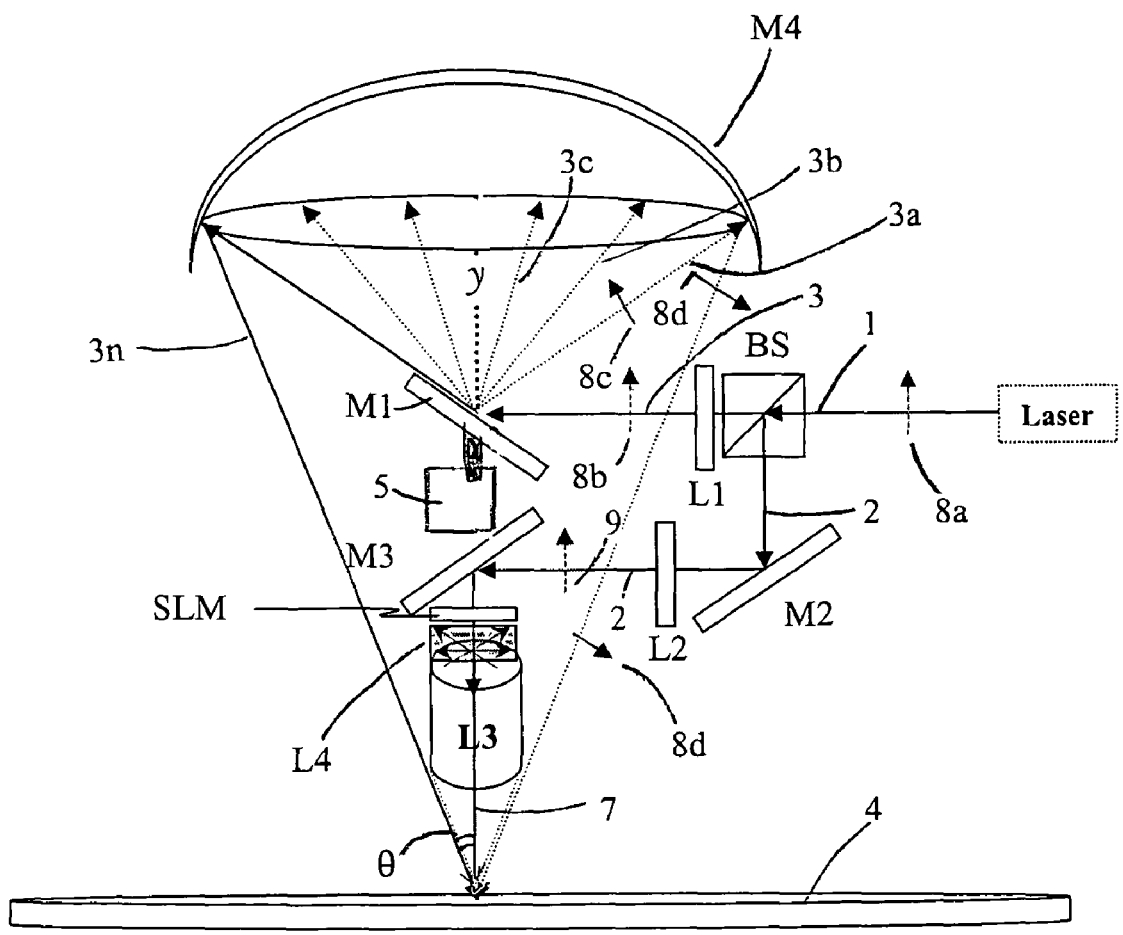
FIG. 1A is a schematic diagram of one embodiment of the present invention that combines azimuthal and angle multiplexing by using an ellipsoidal reflecting surface.

In the present invention, an aspherical reflector is used to direct either a reference beam or an object beam from a coherent light source to a storage location in the recording media.

A coherent light source is provided that generates light for the reference beam and also for an object beam. A pattern encoder such as a spatial light modulator (SLM) is provided to impose one or more data patterns on the object beam. By way of a non-limiting example, an SLM can be a liquid crystal display or a deformable mirror device or a magneto optical device.

Object beam optics are also provided which direct the object beam, produced by using the pattern encoder, to the selected storage location in the medium. During recording, the object beam and the reference beam intersect and substantially overlap in said storage location. This intersection of the mutually coherent reference and the object beams at the selected location in the recording media forms an interference pattern and defines a volume of intersection.

A control system is provided such that the reference beam optics can direct the reference beam and the object beam optics can direct the object beam, both from the coherent light source, to a plurality of storage locations in the recording media in a manner that the beams can be rotated to implement azimuthal multiplexing. The aspherical reflector can be further utilized to independently implement planar angle multiplexing or, more preferably, combinations of azimuthal and planar angle multiplexing. In a preferred embodiment the aspherical reflector is an elliptical reflector element.

A recording media is provided that, by way of example, can be rotated or translated to access a plurality of the storage locations. In the recording media, the modulated (pattern encoded) object beam interferes with the reference beam during writing to thereby generate an interference pattern. The interference pattern contains information of the modulated object beam. A recording media can be, for example, a disk or a card or other suitable form factor.

The control system further provides for synchronizing the timing of the exposure from the coherent light source, media motion, pattern encoding, object beam positioning and alignment, reference beam selection, positioning and alignment, changes in direction of polarization, frame rate of the data page detector, writing of data page holograms, reading of reconstructed data pages, and other events necessary for the operation a holographic drive system.

To effect reading the recorded holographic images, a detector can additionally be provided onto which the reconstructed holograms are imaged by read optics when the control system selects a desired direction for the reference beam.

Embodiments of the present invention may use one or more aspherical reflecting surfaces. As used herein, the term "aspherical reflecting surface" means a reflecting surface in which the surface shape is not spherical. The departure of an aspheric mirror from spherical may be small or may be large and may be measured as a "sag". For the case of an aspheric surface that is a conic section surface (e.g., an ellipse, a parabola or a hyperbola), the surface sag can be expressed as $$sag = \frac{cr^2}{1 + \sqrt{1 - (1+k)c^2r^2}}$$

where c is the curvature and equal to I/R where R is the base radius of curvature, r is the radial coordinate wherein the coordinate origin is the optical axis, and k is the conic constant. For the case of an ellipsoidal surface, k can range from 0 to −1.

An example of an aspherical surface is an ellipsoidal surface having two foci. Such a surface can redirect a light beam passing through one of its focal point to the other focal point. This property advantageously allows selection of any azimuthal angle φ, for any angle θ that is used for planar angle multiplexing. A non-limiting example of implementation of such aspherical reflecting surfaces is an on-axis centered concave ellipsoidal reflector element.

One embodiment of the present invention is shown in FIG. 1A for transmission hologram recording geometry.

Referring to FIG. 1A, a laser beam 1 from the source ("laser"), is directed at a beam splitter BS, where it is split into an object beam 2 and a reference beam 3.

Object beam 2 is directed at mirror M2, beam expanded, collimated, and sized by beam shaping optics L2, redirected by mirror M3 through a spatial light modulator SLM to a polarizing element L4, where its polarization is controlled to match that of the reference beam 3. After passing through beam-shaping optical element L3, object beam 2 is directed at the recording media 4.

Figure 1B:
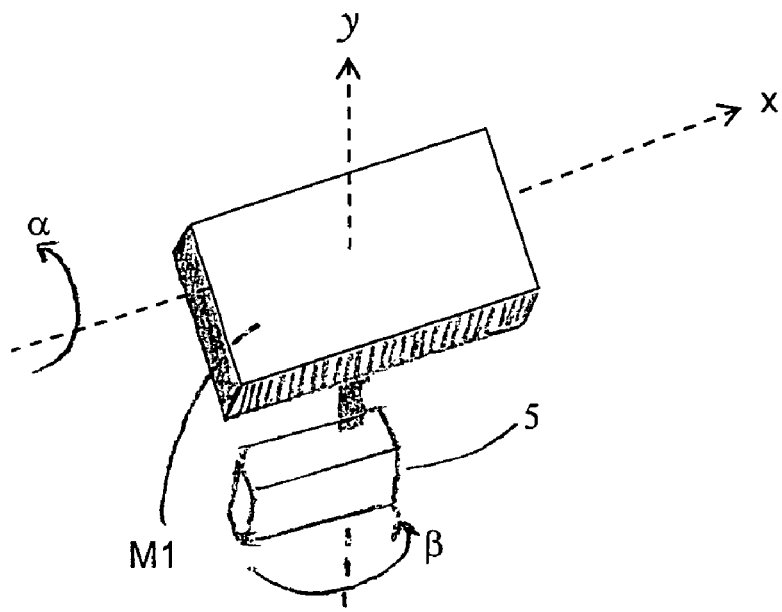
FIG. 1B schematically depicts the movable reflecting surface employed by the embodiment shown in FIG. 1A.

Reference beam 3 is polarized, beam expanded, collimated, and sized by beam shaping optics L1, and then reflected from a first mirror, M1, at a position on the mirror M1 that is located at the near one of the foci of an on-axis centered concave ellipsoidal reflector element M4 (shown in cross-section). Referring now to FIG. 1B, mirror M1 can be rotated or tilted about a first axis, x and, independently, about a second axis, y, perpendicular to axis x, by use of a motive device 5 over a range of selected angles α and β. Accordingly, each rotational or tilted position of mirror M1 generates a reflected reference beam path 3a, 3b, 3c, . . . , 3n from ellipsoidal mirror M4 that intersects the second focus of reflector M4 (located at or near the surface of the recording media 4 at a storage location (labeled 6 in FIG. 2)) coincident with the intersection of the object beam 2.

In one embodiment, the motive device is a two-dimensional galvanometer that operates to redirect the reference beam about two axes that are perpendicular to each other. As used herein, the term "galvanometer" refers to galvanometer optical scanners than can be custom built or obtained commercially through such vendors as Cambridge Technology, Inc. (Cambridge, Mass.) and GSI Lumonics (Bedford, Mass.). These galvanometer optical scanners work on a permanent magnet motor principle wherein a permanent magnet and the magnetic field created by a current running through a wire coil interact, resulting in a torque and force on the actuator's rotor which is suspended on a set of bearings. The rotor is then attached to an optical mirror and in this manner the rotation of the mirror can be controlled by controlling the force applied to it via the control of the current flowing through the wire coils.

In an alternative embodiment, the 2-D galvanometer can be replaced by a two-dimensional MEMS (micro-electro-mechanical systems) reflecting surface such as those developed by Lucent/Agere as a key component within their WaveSplitter free-space optical switch product.

In another embodiment, the motive device for redirecting reference beam 3 includes two independently controlled one-dimensional galvanometers that operate to redirect reference beam 3 about two axes that are perpendicular to each other. In yet another embodiment, the motive device for redirecting reference beam 3 is a one-dimensional galvanometer mounted on another rotary motive device, where the device operates to redirect the reference beam about an axis that is perpendicular to the axis of rotation provided for by the one-dimensional galvanometer. In other embodiments, the motive device can be a linear drive screw or a stepper motor.

Referring to FIG. 11B, the first axis of rotation of mirror M1, x, for example, can be substantially parallel to the surface of the recording media. The angles can be incremented to an aggregate of, for example, more than about +/−5° to +/−20°. Additionally, M1 can be independently rotated by a motive device about the second axis that is perpendicular to the first axis. A non-limiting example, depicted in FIG. 1A, shows that the second axis, y, can additionally be aligned to be collinear with the optical axis 7 of the object beam optics L3. In a preferred embodiment, the rotation can be effected by tilting M1 independently about both axes.

The recorded azimuthally multiplexed images can occupy positions corresponding to azimuthal angles that can be any angle between 0° and 360° and, for example, aggregate to at least about 90°, preferably at least about 180°, more preferably, at least about 270° or even more preferably, at least about 360°. Referring to FIG. 1A, rotation of mirror M1 about axis y redirects reference beam 3 to the inner surface of the concave ellipsoidal reflector M4, such that for each planar multiplexing angle θ, (controlled by rotating mirror M1 about axis x) an arc of preferably at least about π radians can be swept on the surface of M4 by redirected reference beams 3a, 3b, . . . , 3n.

The invention contemplates that the reference beam can be planar, or diverging or converging. The invention can also be employed to read and write reflection type holograms. To achieve recording and reading of a reflection holograms, the elliptical reflecting surface is positioning such that the object beam and reference beam are delivered to the media from opposite sides, such as would be desirable for recording and reading of reflection data page holograms.

FIG. 1A also shows the direction of horizontally polarized light along the path of reference beam 3 (arrows 8a through 8d) as well as for the object beam 2 (arrow 9). This invention contemplates that the direction of horizontal polarization for the reference and object beams is optimally aligned for holographic recording, thereby achieving substantially s-polarization for each holographic recording event in transmission. Polarizing element L4 is provided to effect generation of the aligned s-polarized light for reference beam 3 and object beam 2 by rotation of L4, which, by way of example, can be an optical element such as a wave plate or electro-optic crystal, about the optical axis of the object beam 2 in a manner that matches the rotation effected by rotation of M1, the wave plate oriented perpendicular to the optical axis of the object beam 2 (which, in FIG. 1A, coincides with optical axis 7).

In one embodiment, the present invention is a method of recording azimuthally and angularly multiplexed holograms on an optical recording media. In a preferred embodiment, the storage locations 6 are substantially abutting regions along tracks 10a, 10b, 10c, etc. shown in FIG. 2. In this embodiment, substantially abutting, or non-overlapped and non-abutting, storage locations 6 are used to record holograms during a first pass along a predetermined track (e.g., track 10a). Each of these recorded holograms can have the same combination of planar-multiplexing angle θ and azimuthal multiplexing angle ϕ, or each can be different, or some can be different.

During the second pass along the same track, another combination of θ and ϕ, which is different from the first combination that was used for the first pass along the track, is used for co-locational recording in each of the storage locations recorded during the first pass. This second set of angles is used to record the second "layer" in a storage location of the track. In one embodiment, if the angular velocity of the recording media is fast relative to the repetition rate of the laser exposures, then the first set of storage locations recorded in the track can be separated by some integer number of diameters of a storage location. In this embodiment, recordings can be carried out during the second and subsequent passes along this track such that the recorded storage locations of the second and subsequent passes along the track are located in the interstitial blank regions of the previous pass. When all of the interstitial blank storage locations have been filled in for one track then co-locational multiplexing can be carried out in these storage locations during subsequent passes along the track to record $2^{nd}$, $3^{rd}$, . . . and $m^{th}$ layers. Similarly, co-locational multiplexing can be carried out in the first recorded storage locations during subsequent passes along the track to record $2^{nd}$, $3^{rd}$, . . . and $m^{th}$ layers. In either case the same exposure schedule can be used for the recording times of each subsequent co-locational recording (each layer) in each of the storage locations of the track. This method is advantageous since the entire diameter of a storage location will exhibit substantially the same recording sensitivity, unlike the recording conditions in shift multiplexing. Moreover, although the exposure times for each of the $1^{st}$, $2^{nd}$, $3^{rd}$, . . . and $m^{th}$ layers recorded in a storage location may be different, the exposure times for any one recording layer can be identical for each recording event in a storage location of the track. In one embodiment, that can be preferred for timing requirements of servo methods that, for example, are used to align the optical axis of the object beam and the reference beam angle relative to a reference angle or plane and time the exposure events relative to position of the head over selected storage locations in the media, both the exposure times and the angle combination (θ, ϕ) are identical for each pass along the track until the same layer has been recorded in each storage location along the track.

Figure 2:
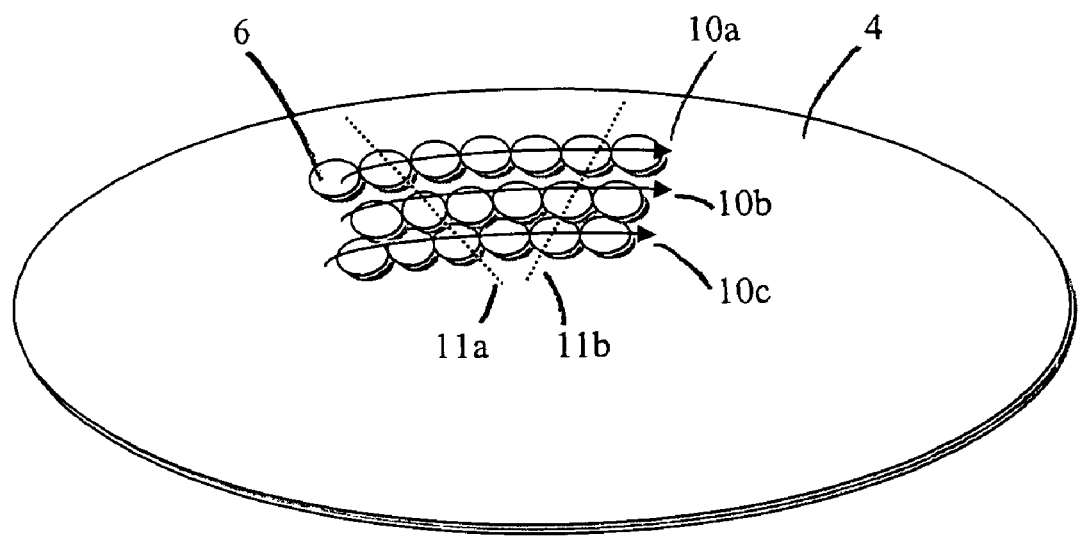
FIG. 2 is a schematic representation of recorded data storage locations that are arranged in tracks on a disk.

FIG. 2 shows a schematic representation of one embodiment of the arrangement of recorded data storage locations that are arranged in groupings such as tracks 10a, 10b, 10c, etc. in disk media. Such tracks, for example, can be arranged in concentric or helical or other suitable configuration, such that each data storage location 6 is a substantially abutting region consisting of M co-locationally multiplexed holograms.

A gantry type design, such as described in U.S. Pat. No. 5,481,523, the entire teachings of which are herein incorporated by reference, can be used to move an optical head comprising a Fourier transform write-read lens pair in order to access the arrangement of storage locations along a tracks at different radii. Other arrangements of the storage locations are also contemplated, such as diamond type packing arrangements described in U.S. Pat. No. 5,566,387, the entire teachings of which are herein incorporated by reference.

Additionally, certain arrangements of data storage locations may be more optimal for accessing at different radii by use of rotary swing arm actuator type mechanisms. Dotted lines 11a and 11b in FIG. 2 schematically depict directions of a sweep motion that could be made by a swing arm device to access storage locations at different radii positions.

If the selected storage location is instead shifted by a distance that is equal to a fraction of the diameter of the first the data storage location, then the rotation or the tilt of M1 to select a new azimuthal angle ϕ effects shift-azimuthal multiplexing which combines spatial and azimuthal multiplexing.

Referring to FIG. 1B, when mirror M1 is tilted to select a new angle α, relative to the position of mirror M1 for the previous recording event at a particular data storage location 6 (see FIG. 2), and recording is then carried out in the same data storage location 6, then a change in the planar (here, also interbeam) angle θ (see FIG. 1A) is effected in the same plane of interaction and co-locational planar-angle multiplexing occurs.

If the selected storage location is instead shifted by a distance that is equal to a fraction of the diameter of the first data storage location, then the tilt or rotation of M1 for changing planar multiplexing angle θ effects shift-planar angle multiplexing which combines spatial and planar-angle multiplexing.

Figure 3:
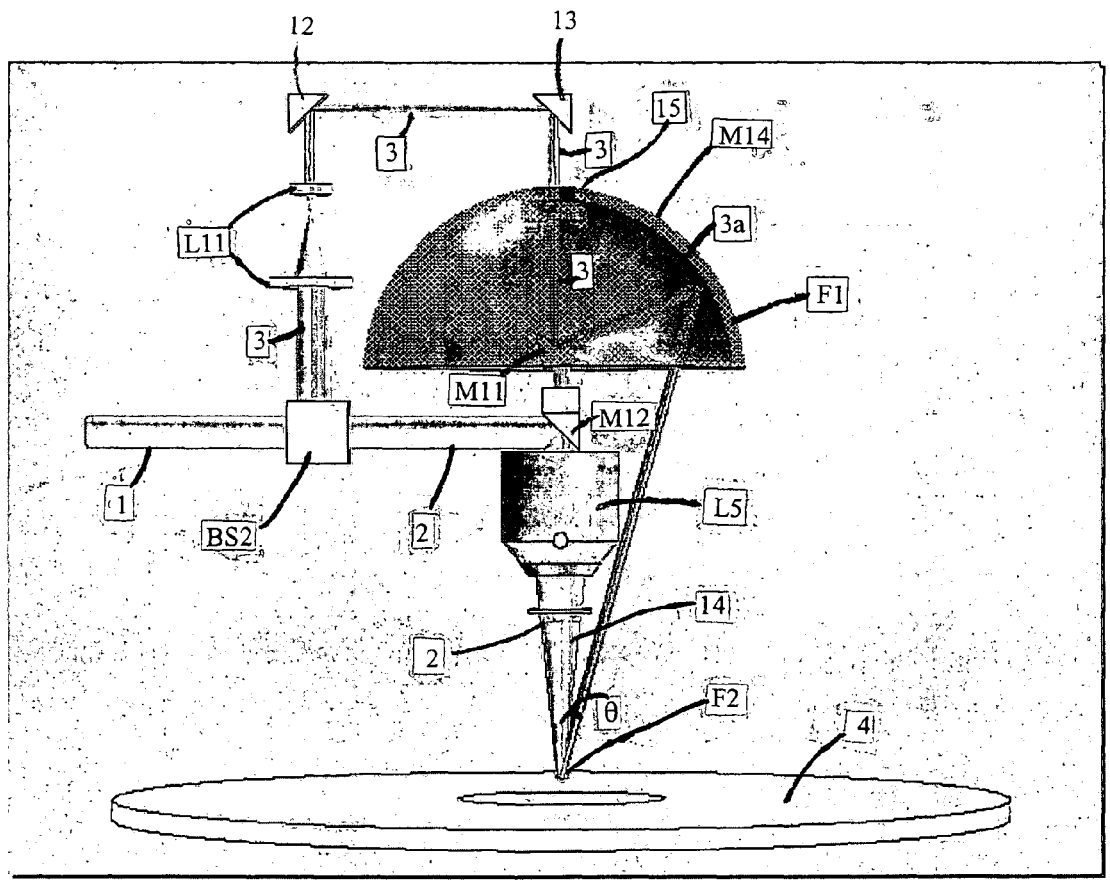
FIG. 3 is a schematic diagram of another embodiment of the present invention that combines azimuthal and angle multiplexing by using an ellipsoidal reflecting surface.

FIG. 3 shows another embodiment of the apparatus of the invention. In this configuration, collimated beam 1 from a laser source (not shown) is split by a beam splitter BS2.

Referring to FIG. 3, object beam 2 is directed at mirror M12, and then redirected at an optical element L5, where it is beam expanded, collimated, and sized by beam shaping optics, directed through a spatial light modulator SLM (not shown) to a polarizing element (not shown), where its polarization is controlled to match that of the reference beam 3. Next, object beam 2 is directed at the recording media 4.

Reference beam 3 is shaped and collimated by reference beam optical element L11 that performs the function of sizing the beam for overlap with object beam 2. Using mirror 12, reference beam 3 is redirected in a path substantially parallel to the surface of the recording media 4 and then redirected by mirror 13 along the center axis 14 of a centered concave ellipsoidal reflecting surface M14, through a hole 15 in the top of reflecting surface M14.

Other optical arrangements are contemplated which, by way of example, can instead polarize, collimate or shape reference beam 3, or any combinations, after it passes into the beam splitter element BS2.

Referring to FIG. 3, reference beam 3 reflects from a rotatable additional reflecting surface M11. M11 is located at the first focus F1 of the elliptical reflecting surface M14, whereas the second focus F2 of M14 is located at the surface of or within the recording media 4. The manner of controlling M11 via rotation about two orthogonal axes, so that it operates to select azimuthal, φ, and planar, θ, angles, is similar to that described above with reference to FIGS. 1A and 1B. In the embodiment depicted in FIG. 3, M11 redirects reference beam 3 to the inner surface of the concave ellipsoidal reflector M14 (producing a redirected beam 3a), such that for each planar multiplexing angle θ (controlled by rotating mirror M11 about axis x, see FIG. 1B), an arc of preferably at least about π radians can be swept on the surface of M14 by redirected reference beams 3a. Accordingly, each azimuthal or planar angle position of M11 generates a reflected reference beam path from M14 that intersects the surface of the recording media 4 at a storage location (labeled 6 in FIG. 2) coincident with the intersection of object beam 2.

Figure 4A:
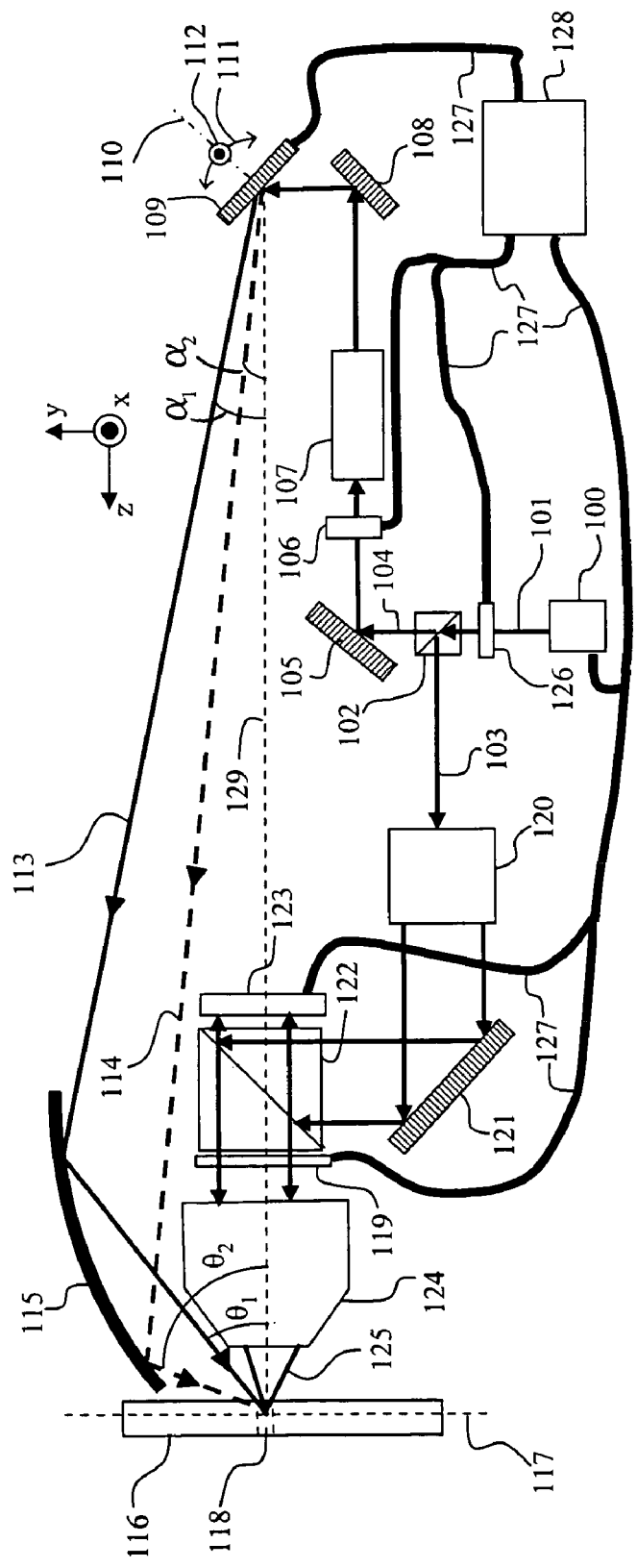
FIG. 4A is a schematic diagram of another embodiment of the present invention that combines azimuthal and angle multiplexing by using an ellipsoidal reflecting surface.

Yet another embodiment of an apparatus and a method of the instant invention is shown in FIG. 4A. In particular, the embodiment of FIG. 4A is different from that of FIGS. 1A and 3 in that the elements that are positioned at the two foci of the ellipsoidal reflecting surface, namely an additional reflecting surface 109 and the recording media 116, are disposed on different sides of any plane that is (a) parallel to a surface of the recording media and (b) intersects the ellipsoidal reflecting surface 109, whereas reflecting surface M1 in FIG. 1A and FIG. 3 and recording media 4 in FIG. 1A and FIG. 3 are on the same side of such planes.

FIG. 4A depicts one embodiment of the current invention wherein a holographic data storage system (HDSS) incorporates an aspheric reflector 115 to direct an optical beam, referred to as the reference beam 113, from a galvanometer controlled mirror 109, such that the reference beam is coincident at a given storage location 118, of a holographic media 116 with an object beam 125. Referring to FIG. 4A, a sufficiently coherent (i.e., interference fringes are created at the media plane 117) optical source 100, for example a laser, emits a polarized optical beam 101 that is incident upon a programmable polarization rotator 126. Said polarization rotator 126 operates to rotate the incident polarization such that the optical beam 101 can be split into two beams 103 and 104 through the use of polarization beam splitter 102 such that the ratio of power between said beams 103 and 104 is a set selected value. In the example of FIG. 4A the beam 104 is referred to as the reference beam and beam 103 is referred to as the object beam. As illustrated, the reference beam 104 is incident upon a planar fold mirror 105 and incident upon a second programmable polarization rotator 106, while in the object beam path a third programmable polarization rotator 119 is present. Polarization rotators 106 and 119 are preferably used to ensure that the direction of polarization of the reference and object beams interfering at the media plane 117 are approximately co-linear such that the fringe visibility of the resulting coherent interference is maximized.

The HDSS schematically shown in FIG. 4A is such that both planar angle and azimuthal multiplexing can be accomplished. However, if only planar angle is used, it is possible to remove the programmable polarization rotator 106 and have only polarization rotator 119 in place in order to ensure that the reference and object beams have collinear polarization vectors at the media plane 117 to enable maximum fringe visibility of the interference field created by said reference and object beams.

Programmable polarization rotators may, for example, be wave plates that are mounted to rotary stages or liquid crystal cells capable of rotating the incident polarization. In either case, said programmable polarization rotators are actuated using a controller 128 that is connected to the programmable polarization rotators via communication and power cables 127.

The reference beam, after the polarization rotator 106, is optionally shaped by an optical system 107 in order to adjust the wave front profile, intensity profile, and/or beam scaling as appropriate for the specific galvanometer-controlled reflecting surface and aspheric reflector design. The reference beam is then folded by the planar fold mirror 108 such that said reference beam is incident upon the 2-D galvanometer controlled mirror 109. The two-dimensional galvanometer-controlled mirror can rotate about an axis 110 in the y-z plane as indicated by the bi-directional arrow 111 as well as out of the y-z plane as indicated by the arrow 112. The two-dimensional galvanometer-controlled mirror may have a planar mirror surface that the reference beam reflects off of, but, in general, will have an aspheric surface or other suitable curved reflecting surface. In one example, the surface of the galvanometer-controlled mirror is designed with a specific asphericity such that the footprint of the reference beam at the media plane 117 remains approximately constant for all possible reference beam angles the HDSS is designed to operate at.

The reference beam, after being reflected off of the galvanometer controlled mirror, is incident upon an aspheric reflector 115. FIG. 4A, by way of example, shows that two different reference beams 113 and 114 can be created at different times when the galvanometer-controlled mirror is rotated about the x axis to two different rotary positions, wherein said reference beams propagate at angles $\alpha_1$ and $\alpha_2$, respectively, relative to axis 129 and lie solely within the y-z plane. The rotary settings required to reflect a reference beam at a specific angle are controlled by a controller 128 that communicates with the galvanometer controlled mirror via a communication cable 127. Upon reflecting from the aspheric reflector 115, all of the designed reference beams are incident upon the holographic media 116 such that at given media plane 117 they fall within a selected storage location 118. The two reference beams 113 and 114 make planar multiplexing angles $\theta_1$ and $\theta_2$, respectively, with the optical axis 129 of the object beam.

The media plane 117 at the storage location 118 and the galvanometer controlled mirror 109 form two foci of the aspheric mirror 115. Such aspheric mirror can be substantially ellipsoidal, with certain aspheric departures to assist in ensuring the reference beam footprint at the media plane is uniform. Changing the conic constant of an ellipsoid provides a means to change the magnification of the galvanometer-controlled angle to the angle at the holographic media. Consequently, such a design can provide for the large interbeam angles that are required for high-capacity holographic storage (e.g., $\theta=60°$) with relatively little optical deflection of the reference beam at the galvanometer-controlled mirror (e.g., $\alpha=8°$).

In the object beam path, the object beam 103 is transformed by beam shaping optics 120 such that the emerging beam has the correct beam size, intensity distribution and/or wavefront distribution. As illustrated, the object beam reflects off of a planar fold mirror 121 and is incident upon a polarizing beam splitter (PBS) 122. The polarization of the incident object beam is such that the optical beam is reflected onto a pixelated spatial light modulator (SLM) 123. As an example, SLM 123 could be a 512 by 512 pixel ferro-electric liquid crystal display. In some embodiments, SLM can rotate the polarization for "ON" pixels while "OFF" pixels do not have their polarizations rotated. In this manner the beam that reflects off of an SLM and through a PBS modulated with a series of pixels that either have light or do not.

After the PBS, the object beam is incident upon the previously described polarization rotator 119 and onto the write optics 124. For high capacity, lower bit error rate (BER) HDSS, write optics 119 consist of a collection of optical elements that are designed to be preferably diffraction or nearly diffraction limited, high numerical apperture (e.g., 0.3 to 0.5) objectives wherein a high-quality Fourier transform of the SLM spatial information can be created. The holographic media 116 is positioned such that the media plane 117 where one designs the system to record at is where the object and reference beam interfere. This may correspond with the focal plane of the write optics 124 or may be detuned to some fractional Fourier transform plane.

As depicted in FIG. 4A, by rotating the galvanometer-controlled mirror about the x-axis, the reflected reference beam remains in the y-z plane. Consequently, only the interbeam (planar angle multiplexing) angle $\theta$ is changed for different reference beam orientations. In this manner, the HDSS can record plane-wave multiplexed holograms or read previously recorded plane-wave multiplexed holograms, wherein each hologram contains information from a different pixilated data page as displayed by the SLM via controller 128 and cable 127.

The system depicted in FIG. 4A is a cross-section of the actual optical system of the HDSS. Accordingly, the aspherical reflector 115 can be made to wrap around the write optics 124 and the beamsplitter 122. In this manner, the HDSS can achieve azimuthal multiplexing of holograms as will be apparent by the detailed description of FIG. 4B.

Figure 4B:
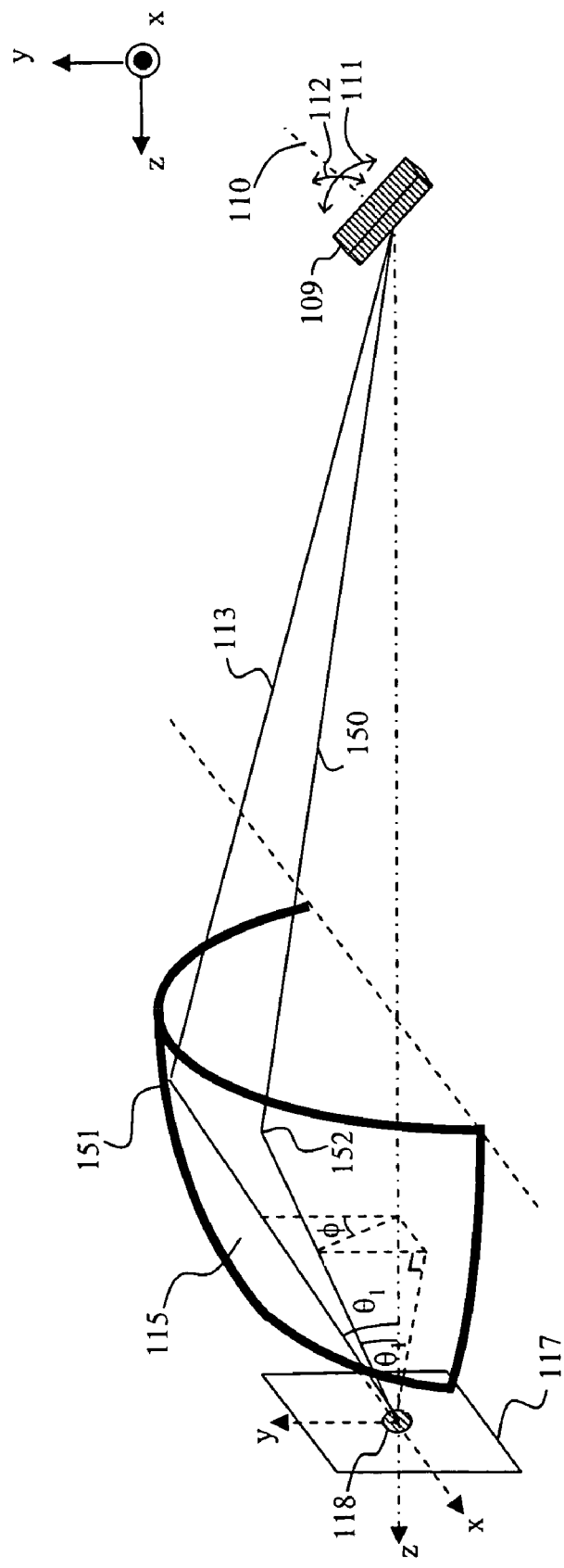
FIG. 4B is perspective view of the ellipsoidal mirror used in the embodiment shown in FIG. 4A.

Depicted in FIG. 4B is a perspective schematic of the aspheric reflector 115, galvanometer-controlled mirror 109, and media recording plane 117 of FIG. 4A. If the mirror 109 is rotated about the x axis to a specific angle, then the same reference beam 113 that was illustrated in FIG. 4A can be created. Reference beam 113 intersects with the aspheric reflector 115 at point 151.

Alternatively, the galvanometer-controlled mirror can be rotated both about the x axis and about an axis not parallel to the x-axis such that a reflected reference beam 150 is created that reflects at the point 152 on the aspheric reflector 115. The motion of mirror 109 can be controlled such that the reference beam 152, upon reflecting off of the aspheric mirror 115, intersects the media plane 117 at the same angle $\theta_1$ relative to the z axis as the reference beam 113, but is rotated by an angle $\phi$ about z axis. In this manner, the two reference beams 113 and 150 intersect the media plane at the same storage location 118, but differ only in their azimuthal angle, thereby allowing for planar azimuthal multiplexing of holograms. By rotating mirror 109 such that the reference beam intersects other positions on the aspheric mirror, both planar angle and azimuthally multiplexed holograms can be written and read.

The HDSS of the present invention is to be considered as an illustrative example only of the disclosed invention, as one skilled in the art can conceive numerous variations. In one example, the two-dimensional galvanometer controlled mirror 109 and fold mirror 108 of FIG. 4A are replaced by the optomechanical system depicted in FIG. 4C.

Figure 4C:
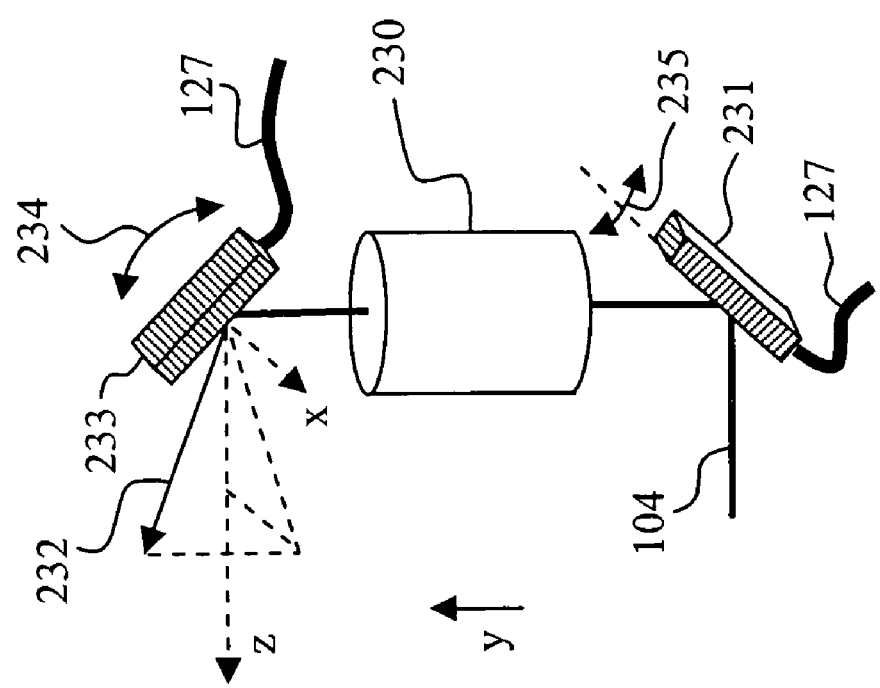
FIG. 4C is a schematic diagram of an optomechanical system employed by one embodiment of the embodiment shown in FIG. 4A.

FIG. 4C depicts that light incident upon this first galvanometer controlled mirror is imaged from a second galvanometer controlled mirror that rotates about an axis orthogonal to the rotation axis of the first galvanometer controlled mirror, thereby enabling the required two directions of motion that are perpendicular to each other.

In the embodiment shown in FIG. 4C, the two-dimensional galvanometer-controlled mirror 109 is replaced by a one-dimensional galvanometer-controlled mirror 233, whose reflective mirror surface rotates about the x-axis (as indicated by the bidirectional arrow 234) and is controlled via the cable 127. Further, the static fold mirror 108 is replaced by a second one-directional galvanometer-controlled mirror 231, whose reflective mirror surface rotates about an axis that lies in the y-z plane (for this example, said rotation axis can be an axis that is in the x-y plane and is oriented 45° relative to both y and z-axes). In between the two galvanometer-controlled mirrors 231 and 233, there is an imaging system, preferably a 4F imaging system. This allows the footprint of the reference beam 104 on the galvanometer-controlled mirror 231 to be imaged onto the reflecting surface of galvanometer-controlled mirror 233. In this manner, two one-dimensional galvanometer-controlled mirrors can be used to generate a reference beam (not shown) that can propagate at non-zero angles relative to either or both of the x-z and y-z planes for the purposes of planar, azimuthal, or planar and azimuthal holographic multiplexing.

In yet another embodiment, galvanometer-controlled mirror 109 is replaced by two optical wedges (not shown) that can each rotate separately about the z axis to address the reference beam in two dimensions. In yet further embodiment (not shown), mirror 109 is replaced by a one-dimensional galvanometer-controlled mirror that, additionally, rotates about the x axis.

A further embodiment of the example depicted in FIGS. 4A and 4B is to use an annular reflector similar to mirror M4 depicted in FIGS. 1A and 3.

Figure 5A:
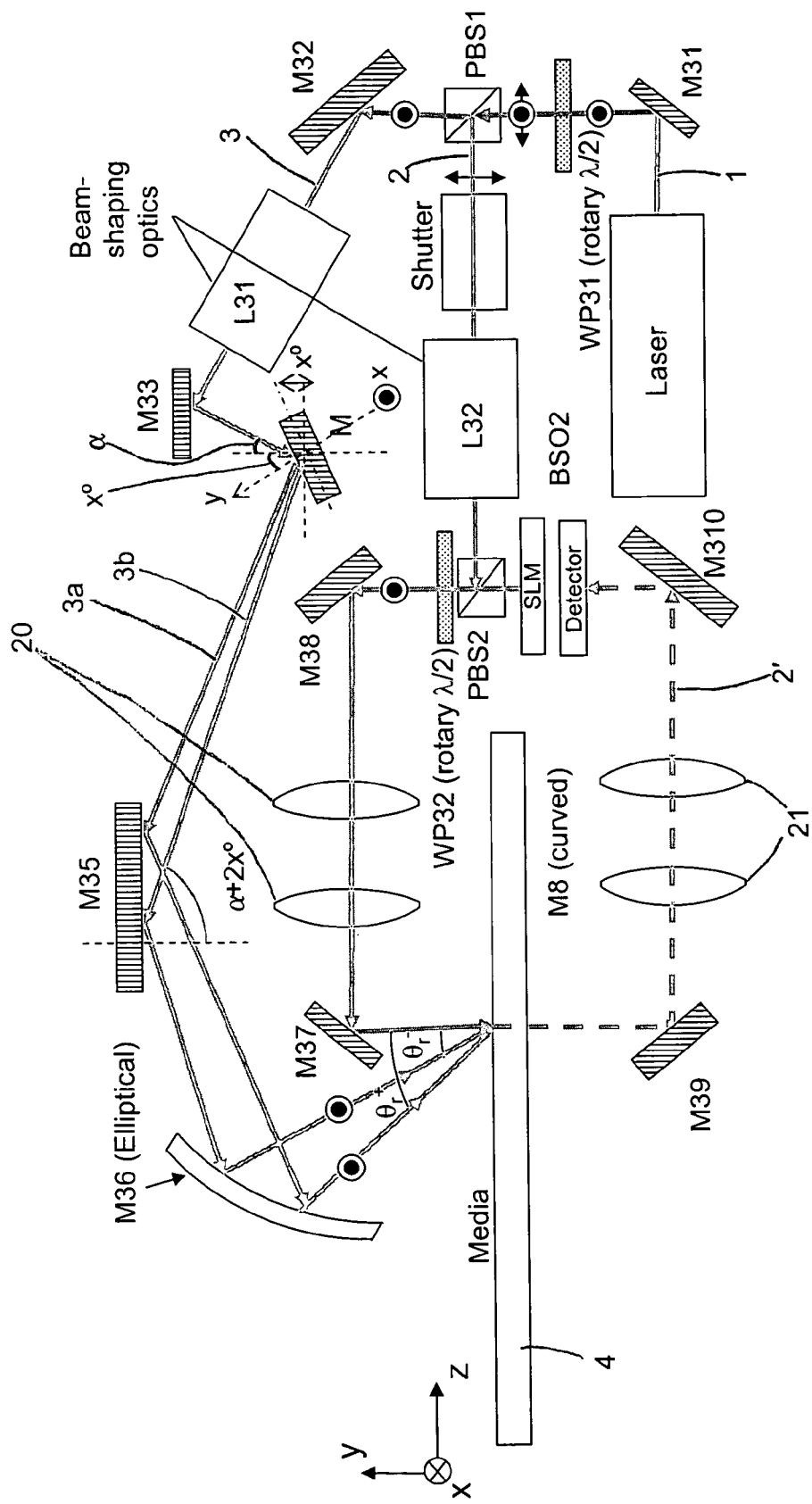
FIG. 5A is a schematic diagram of another embodiment of the present invention that combines azimuthal and angle multiplexing by using an ellipsoidal reflecting surface.
Figure 5C:
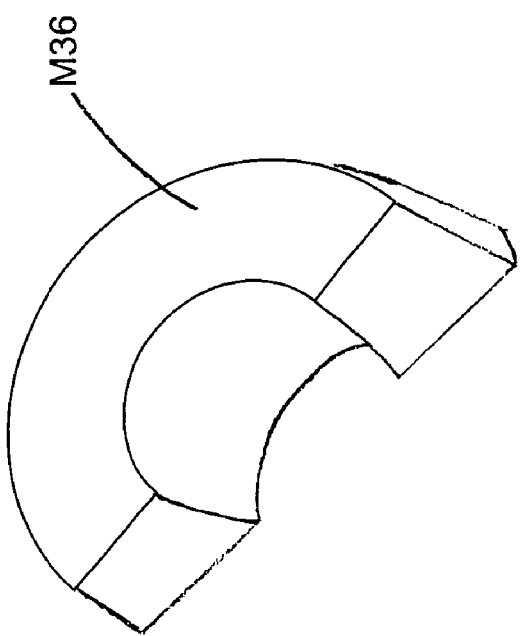
FIG. 5C is a perspective view of an ellipsoidal mirror utilized in the embodiment depicted in FIG. 5A.

In another embodiment of this invention, depicted schematically in FIG. 5A, a second additional reflecting surface M35 is used to redirect reference beam that is reflected from a rotatable mirror M34 to ellipsoidal mirror M36. FIG. 5C shows the three-dimensional shape of the ellipsoidal mirror M36.

As shown in FIG. 5A, beam 1 from the laser source is directed at mirror M31, has its polarization adjusted by a wave plate WP31, and is then split by a polarized beam splitter PBS1. Object beam 2 is then directed through a shutter. The shutter is used to shut off object beam 2 when the device is used for reading previously recorded holograms. Next, object beam 2 is directed through beam-shaping optical element L32 to another polarized beam splitter PBS2, where it is redirected first at the reflection-type spatial light modulator (SLM) for encoding. From the SLM, the object beam is passed through a second wave plate WP32, where its polarization is matched to that of reference beam 3 and then to a reflecting surface M38 and, through lens system 20, to mirror M37 and on to the recording media.

Figure 5B:
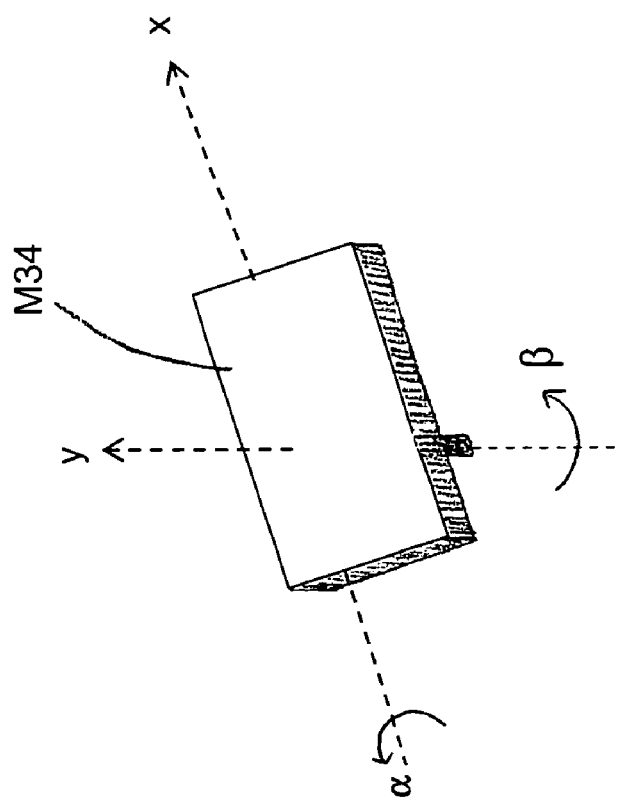
FIG. 5B schematically depicts the movable reflecting surface employed by the embodiment shown in FIG. 5A.

Reference beam 3 coming from PBS1 is redirected by mirror M32 through beam-shaping optical element L31 and on to an additional reflecting surface M34, which, in this example, is a planar mirror rotatable independently about two axes. Upon reflection from mirror M34, reference beam 3 is redirected at a selected angle under the control of mirror M34 that can be independently rotated about tow orthogonal axis x and y. (Mode of control of movable reflecting surface M34 is described above, e.g. with reference to mirror M1 in FIGS. 1A and B and is also shown on FIG. 5B.) One of redirected reference beams (3a or 3b etc.) is directed to a second additional reflecting surface M35. M35 redirects the reference beam to ellipsoidal mirror M36. Upon reflection from M36, the reference beam is redirected to the recording media.

When the device shown in FIG. 5A is used for reading, the shutter blocks object beam 2, while reference beam 3 is allowed to travel as described above. When reference beam impinges into the recording media 4, a reconstructed object beam 2' (shown in dash line) is produced. Mirror M39 directs reconstructed object beam 2' through lens system 21, that matches the optical characteristics of lens system 20. After passing through lens system 21, reconstructed object beam 2' is directed by mirror M310 to a detector for decoding.

The embodiment depicted in FIG. 5A can be advantageous in that the angle of deflection of the rotatable mirror is magnified in order to achieve the final reference beam angle at the media. In the non-limiting example shown in FIG. 5A, if mirror M34 is tilted from its original position by a mechanical angle of x° about axis x, then the (optical) angle of incidence of the reference beam (labeled 3b in FIG. 5A) at an additional reflective surface M35 will change by an angle of 2x°. Consequently, the rotatable mirror M34 does not need to move as far and therefore can move faster between the required angular positions needed to implement multiplexing of the data page holograms.

Due to the magnification of optical angles, one is able to achieve an azimuthal angle ($\phi$) multiplexing in the range of $\phi$ from 0 to at least about 180° with relatively minor (e.g., ±10°) mechanical angle movements $\alpha$ and $\beta$ (see FIG. 5B) of the mirror plane of M34. By allowing the mirror, controlled, for example, by a two-dimensional galvanometer, to only partially rotate (tilt) about two independent axes x and y, the access time to address all required angles can be reduced.

For instance, if a 20° movement of rotatable mirror M4 is required (moving from $\beta$=−10° to +10°) to swing from addressing an image at $\phi$=0 to an image at $\phi$=180° image, a 3 mm diameter one-dimensional galvanometer can achieve this in 880 µsec (99% settled, Cambridge Technology, model 6210). This speed is significantly faster than the time required for a stage to rotate over an angle sweep of 180°. In this embodiment, the rate limiting step for the time increment between recording events would be a movement req. to select azimuthal recording conditions.

Additionally, the ellipsoidal mirror can be designed with even more angular magnification, such that a range of azimuthal angles $\phi$=0-180° corresponds to only 10° of mirror movement, thereby allowing for even faster access times for recording and reading with azimuthal multiplexing.

Planar-angle multiplexing is always substantially faster, since the increments of tilt motion for selecting planar multiplexing angle $\theta$ are much smaller due to Bragg selectivity.

If the ellipsoidal mirror is positioned closer to the media plane, its size can be reduced substantially. The shape of the ellipsoidal mirror is dictated by the angular magnification required. If the maximum mechanical angle achieved is $\theta_{m\_max}$ and the minimum reference beam angle is at the $\theta_{R\_min}$, then the ellipticity of the ellipsoidal mirror is given by $$e = \frac{-\sin(\theta_{R\_min}) \pm \sin(2\theta_{m\_max})}{\sin(2\theta_{m\_max} - \theta_{R\_min})} \quad (3)$$

Figure 6:
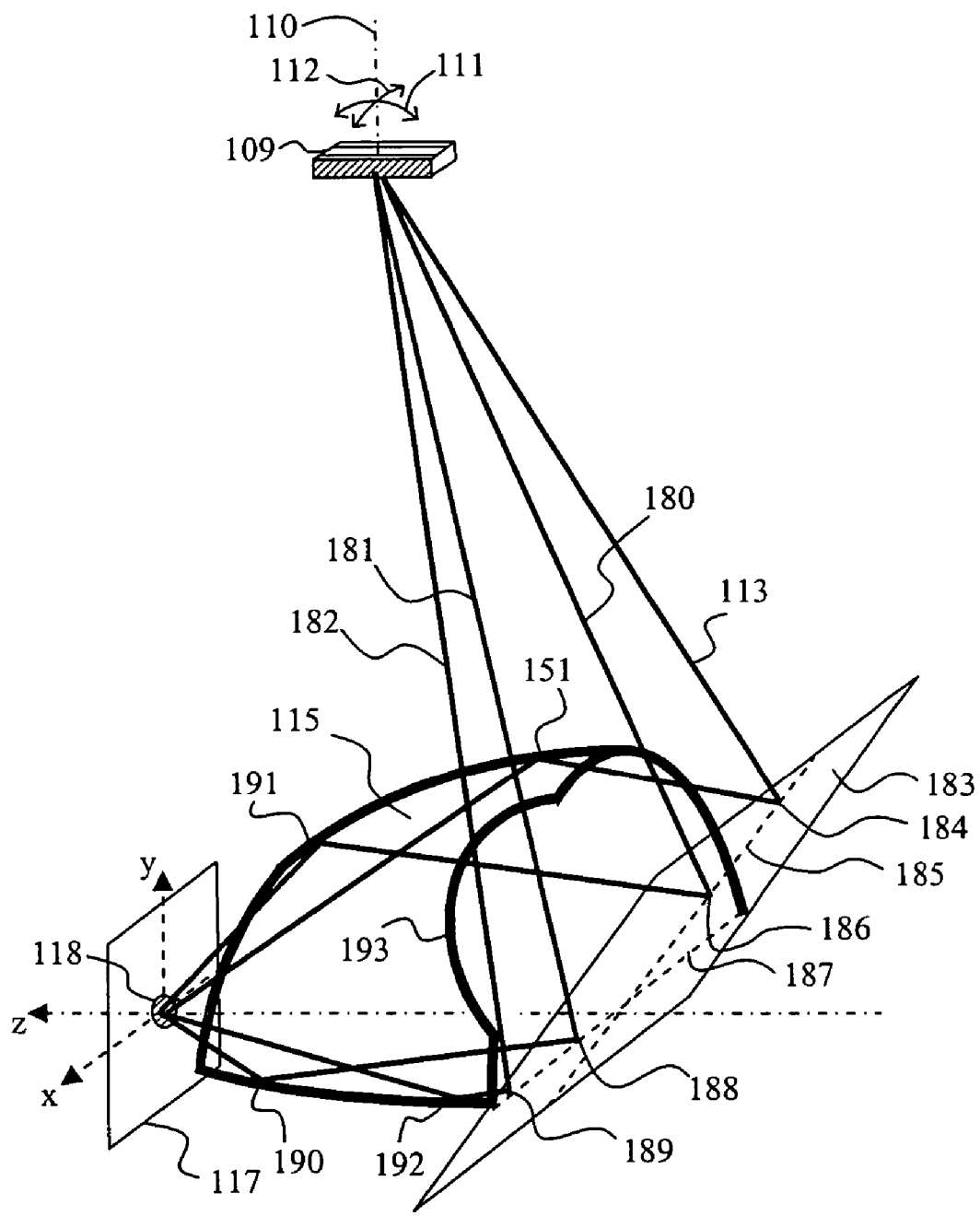
FIG. 6 is a schematic diagram of another embodiment of the present invention that combines azimuthal and angle multiplexing by using an ellipsoidal reflecting surface.

Another embodiment of a method and an apparatus of the present invention that employs a second additional reflecting surface to achieve angle magnification is shown in FIG. 6. Unlike the embodiment of FIG. 5A, where the movable mirror M34 is located at or near one of the foci of the ellipsoidal reflecting surface, the movable mirror 109 of FIG. 6 is not at one of foci of the ellipsoidal reflecting surface 115, but is positioned so that the sum of optical path lengths of a reference beam from the elliptical surface 115 to a point of reflection at the second additional reflecting surface 183 plus the length from 115 to a selected storage location at media 118 is equal to either major (as in FIG. 6) or minor axes of the ellipsoid surface 115.

FIG. 6 is a 3-D schematic diagram of how the aspheric reflector 115 and two-dimensional galvanometer-controlled mirror system 109 can incorporate a fold mirror 183 for a purpose of compacting the opto-mechanical design. For this specific example, the fold mirror 183 is a planar mirror that is tilted about the x-axis and has no tilt about the y-axis. In general the fold mirror can be aspheric and can be used to assist in preserving the footprint of the reference beam as a function of angle of incident at the media plane 117. In FIG. 6, four re-directed reference beams (113, 180, 181, and 182), by way of example, are depicted as emanating from the galvanometer controlled mirror 109. These reference beams are shown to be reflecting off of the galvanometer controlled mirror surface for four different orientations of the said galvanometer controlled mirror. The reference beams 113 and 180 are the result of the galvanometer controlled mirror rotating about the x axis and as such, both before and after encountering the fold mirror 183 lie within the x-y plane. Said reference beams reflect off of the fold mirror at 184 and 186, respectively, and then reflect off of the aspheric mirror at points 151 and 191, respectively. The reference beams 181 and 182 are the result of the 2-D galvanometer-controlled mirror 109 rotating about the z-axis and these beams intercept the fold mirror 183 at points 188 and 189, respectively, and reflect towards the aspheric reflector 115 and reflect off of the aspheric reflector 115 at points 190 and 192, respectively, and both intersect the media plane 117 at the same storage location 118. The reference beams 181 and 182, once reflected off of the fold mirror 183, lie entirely in the x-z plane and are reference beams operating for planar angle multiplexing, but which propagate at an azimuthal angle of 90° separated from reference beams 113 and 180 as viewed at the storage location 118.

For a more compact holographic data storage system (HDSS), it is desirable that the fold mirror 183 be as close as possible to the media plane 117. However, not all reference beams reflecting off of the 2-D galvanometer-controlled mirror may be able to clear the outside of the aspheric mirror 115 in order to reflect off of the fold mirror 183. Therefore, in certain cases, the aspheric mirror 115 requires cutouts such as the cutout labeled in FIG. 6 as 193. Such cutouts do not degrade the performance of the HDSS since the entire surface of the aspheric mirror is not utilized.

Holograms that are azimuthally multiplexed require that a minimum azimuthal angle be maintained between azimuthally multiplexed holograms. This minimum angle, see K. Curtis et al. "Method for holographic storage using peristrophic multiplexing," *Opt. Lett.*, 19, 13, 993-994 (1994), can be in the range of 45° to 90° for a HDSS comprising high numerical aperture for the object beam lens (see, FIG. 4A, 124). Consequently, although a semi-annular aspheric mirror is depicted (so that the points of intersection of redirected reference beams with aspherical mirror 115 can sweep an arc of 180°), the required reference beams reflect off of only specific azimuthal slices of said aspheric mirror. The HDSS can thus be designed so that the azimuthal slice of the aspheric mirror that is compromised by the cutout 193 is an azimuthal slice that is never used during the course of azimuthal multiplexing.

Those skilled in the art can envision other modifications to the designs depicted in FIG. 6 and it is the intention of this disclosure that these modifications are covered. For instance, as described, only certain azimuthal slices of aspheric mirror 115 are used during recording. Therefore, the aspheric reflector 115 need not be a single surface of rotation about the z-axis, but rather can be composed of distinct reflectors where each reflector is designed, for example, to operate for a single azimuthal multiplexing angle $\phi$. It is therefore not necessary for each distinct reflector to be curved in the azimuthal direction and as such they do not need to provide any power to the reflecting reference beams and this may be considered advantageous.

Figure 7:
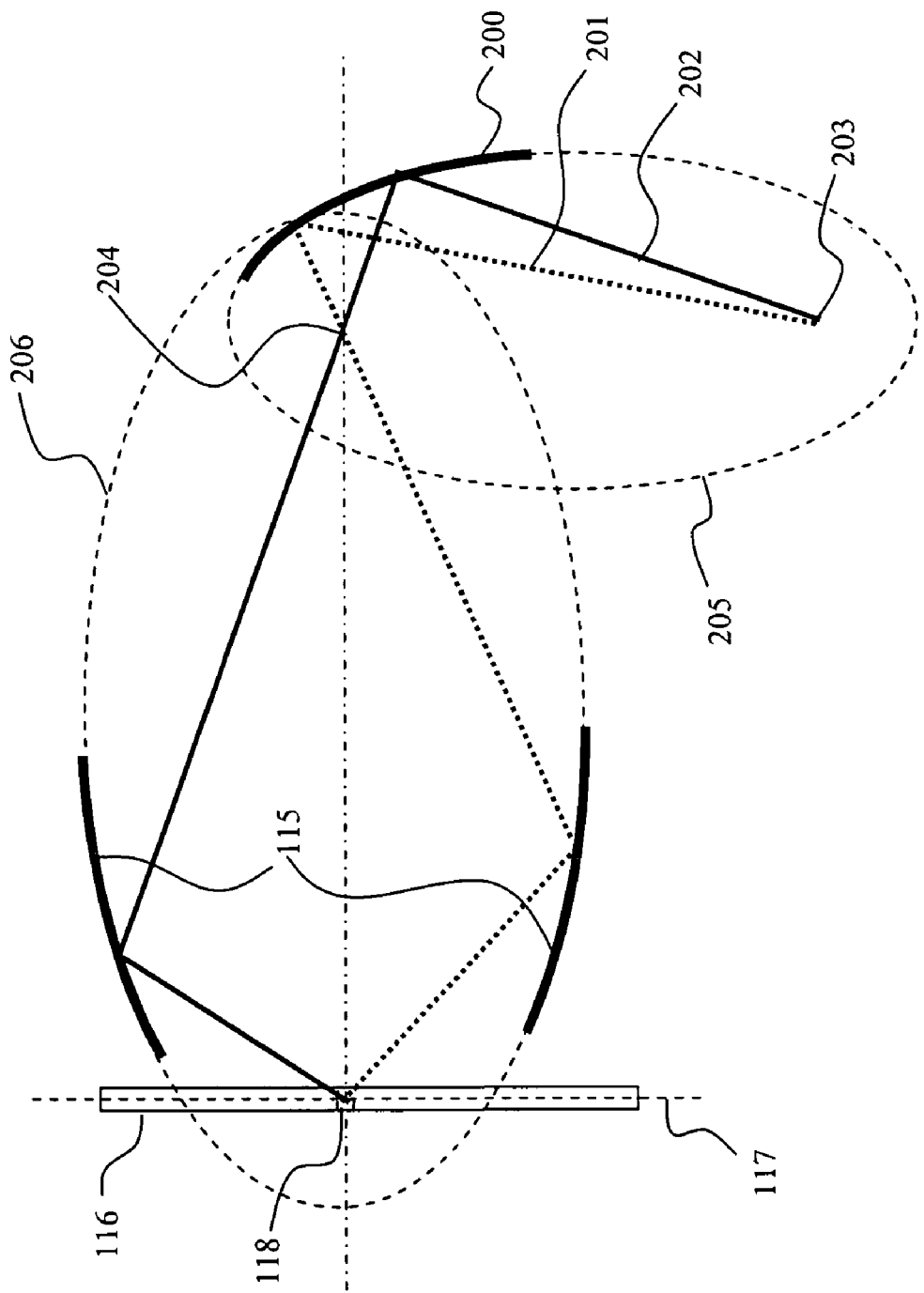
FIG. 7 is a schematic diagram of another embodiment of the present invention that combines azimuthal and angle multiplexing by using an ellipsoidal reflecting surface and an additional ellipsoidal reflecting surface.

Another embodiment of a method and an apparatus of the present invention that employs an additional aspherical reflecting surface to achieve angle magnification or a means of correction for differences in cross-sectional area of the reference beam at different values of θ and/or beam folding is shown in FIG. 7. The embodiment of FIG. 7 employs two portions of ellipsoidal reflecting surfaces. The two ellipsoids share one focus (labeled 204 in FIG. 7). As a result, the reference beam reflected from the first ellipsoidal reflecting surface 200 is directed to the second ellipsoidal reflecting surface 115. The ellipsoidal surface 115 redirects the beam towards the recording media 116.

FIG. 7 is a two-dimensional cross-section of a galvanometer-controlled aspheric mirror system for a holographic data storage system (HDSS). The 2-D galvanometer-controlled mirror is placed at location 203. The reference beams emanating from this position, such as reference beams 201 and 202, for example, reflect off of the second aspheric reflector 200. The second aspheric reflector 202 may be substantially an ellipsoidal mirror such as the one shown, e.g. in FIG. 4A.

In the embodiment shown in FIG. 7, the foci of the additional ellipsoidal reflecting surface are the positions 203 and 204 (the ellipsoid in its entirety would span the outline depicted by the dotted curve 205). The first aspheric mirror 115 may be substantially ellipsoidal as well and is positioned such that one of its foci corresponds to one of the foci of the second ellipsoid 204 and the other focus corresponds to the storage location 118 of the holographic media 116.

The ellipticity of the two aspheric mirrors are preferentially designed such that the angular movement of the 2-D galvanometer-controlled mirror (or operationally similar electro-mechanical-opto systems) placed at 203 is sufficient to achieve the required angles of incidence at the media plane 117.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of recording at least two multiplexed holograms comprising the steps of
   reflecting either an object beam or a reference beam from at least one aspherical reflecting surface having two focal points, said at least one aspherical reflecting surface having portions that correspond to azimuthal angles spanning an azimuthal arc of 360°, the object beam and the reference beam generated by a coherent light source, thereby causing the object beam and the reference beam to intersect and form an interference pattern at a selected storage location in a recording media at or near one of the two focal points, thereby recording a first hologram at said selected storage location; and
   rotating at least one of a portion of the reference beam impinging on a recording media at the selected storage location and a portion of the object beam impinging on the recording media at said selected storage location through a selected azimuthal angle about an axis that lies in the plane formed by optical axes of said portions of the object beam and the reference beam impinging on the recording media,
   wherein said axis passes through the selected storage location, and
   wherein an angle between optical paths of said portions of the object beam and the reference beam impinging on the recording media is preserved, thereby recording at least two azimuthally multiplexed holograms.

2. The method of claim 1 further including a step of rotating at least one of the portion of the reference beam impinging on the recording media at a selected storage location or the portion of the object beam impinging on the recording media at a selected storage location or combinations thereof through a selected planar angle about an axis that is perpendicular to the plane formed by the optical axis of said portions of the object beam and the reference beam impinging on the recording media,
   wherein said axis passes through the selected storage location, and thereby recording at least two planar-angle multiplexed holograms.

3. The method of claim 2 wherein a plurality of azimuthally multiplexed and planar-angle angularly multiplexed holograms is recorded.

4. The method of claim 3 wherein the reference beam is reflected from at least the first aspherical reflecting surface.

5. The method of claim 1 wherein at least one portion of the first aspherical reflecting surface is an ellipsoidal reflecting surface.

6. The method of claim 5 further including the steps of
   directing the reference beam to said ellipsoidal reflecting surface by reflecting the reference beam from at least one additional reflecting surface.

7. The method of claim 6 further including the step of
at least partially rotating either one or both the ellipsoidal reflecting surface and the additional reflecting surface through a series of selected angles, about a first axis, thereby rotating the portion of the reference beam impinging on the recording media at the selected storage location with respect to an axis formed by the optical axis of the portion of the object beam impinging on the recording media at said storage location through a series of azimuthal multiplexing angles $\{\phi_j\}$, wherein j is an integer, while preserving the angle between said portions the object beam and the reference beam impinging on the recording media at said storage location.

8. The method of claim 7 further including the step of
at least partially rotating either one or both the ellipsoidal reflecting surface and the additional reflecting surface through a series of selected angles about a second axis, perpendicular to the first axis, thereby changing an angle between the portions of the object beam and the reference beam impinging onto the selected storage location in a recording media through a series of planar-angle multiplexing angles $\{\theta_i\}$, wherein i is an integer.

9. The method of claim 6 further including the steps of:
at least partially rotating either one or both the ellipsoidal reflecting surface and the additional reflecting surface through a series of selected angles with respect to a first axis, thereby changing an angle between the portions of the object beam and the reference beam impinging onto a recording media at the selected storage location through a series of planar-angle multiplexing angles $\{\theta_i\}$, wherein i is an integer; and
for each selected planar-angle multiplexing angle $\theta_i$, at least partially rotating either one or both the ellipsoidal reflecting surface and the additional reflecting surface through a series of selected angles, about a second axis, perpendicular to the first axis, thereby rotating the portion of the reference beam impinging on the recording media at the selected storage location about an axis formed by the optical axis of the portion of the object beam impinging on the recording media at said storage location through a series of azimuthal multiplexing angles $\{\phi_j\}$, wherein j is an integer, while preserving the angle between said portions the object beam and the reference beam impinging on the recording media at said storage location.

10. The method of claim 9 wherein the additional reflecting surface is at least partially rotated with respect to the first and the second axes.

11. The method of claim 6 wherein the additional reflecting surface is a planar mirror.

12. The method of claim 6 wherein the additional reflecting surface is a curved reflecting surface.

13. The method of claim 6 wherein the additional reflecting surface is an aspherical surface.

14. The method of claim 6 wherein said additional reflecting surface and the recording media are disposed on the same side of any plane that is (a) parallel to a surface of the recording media and (b) intersects the ellipsoidal reflecting surface.

15. The method of claim 14 wherein a portion of the reference beam impinging on the additional reflecting surface is coaxial with an axis formed by the two foci of the ellipsoidal reflecting surface.

16. The method of claim 14 wherein a portion of the reference beam impinging on the additional reflecting surface is not coaxial with an axis formed by the two foci of the ellipsoidal reflecting surface.

17. The method of claim 6 wherein said additional reflecting surface and the recording media are disposed on different sides of any plane that is (a) parallel to the surface of a recording media and (b) intersects the ellipsoidal reflecting surface.

18. The method of claim 6 wherein directing the reference beam further includes:
directing the reference beam reflected from the additional reflecting surface to a second additional reflecting surface; and
reflecting the reference beam from said second additional reflecting surface.

19. The method of claim 6 wherein directing the reference beam further includes:
directing the reference beam reflected from the ellipsoidal reflecting surface to a second aspherical reflecting surface; and
reflecting said reference beam from the second aspherical reflecting surface.

20. The method of claim 1 wherein the first aspherical reflecting surface is a segmented surface comprising a group of planar mirrors.

21. A method of recording azimuthally multiplexed holograms in an optical recording media, comprising the steps of:
(a) predetermining a series of azimuthal multiplexing angles $\{\phi_j\}$, wherein j is an integer;
(b) selecting an angle $\phi_a$ wherein a is an integer and $\phi_a$ is selected from the series $\{\phi_j\}$;
(c) directing an object beam and a reference beam that are mutually coherent at a selected data storage location situated along a selected track on the optical recording media,
wherein the reference beam is reflected from at least one aspherical reflecting surface having two focal points, said at least one aspherical reflecting surface having portions that correspond to azimuthal angles spanning an azimuthal arc of 360°, and
wherein a portion of the reference beam impinging onto the recording media has an azimuthal angle $\phi_a$ about an axis that lies in the plane formed by optical axes of portions of the object beam and the reference beam impinging on the recording media at or near one of the two focal points;
(d) repeating step (c) for a plurality of selected data storage locations, thereby recording a plurality of holograms, each at a selected storage location along the selected track on the optical recording media; and
(e) repeating steps (c) through (d) for a different integer a, wherein the subsequent holograms are recorded in the selected track using the storage locations utilized by the previously recorded plurality of holograms.

22. The method of claim 21 further including repeating steps (a) through (e), wherein a different track on the optical recording media is selected.

23. The method of claim 21 wherein the data storage locations along a track are non-overlapping and substantially abutting.

24. The method of claim 21 wherein the optical recording media is a disk or card.

25. The method of claim 21 wherein the at least one aspherical reflecting surface is a portion of an ellipsoidal mirror.

26. The method of claim 21 further including a step of reflecting the reference beam from at least one additional reflecting surface.

27. A method of recording azimuthally and angularly multiplexed holograms on an optical recording media, comprising the steps of:
  (a) predetermining a series of planar-angle multiplexing angles $\{\theta_i\}$, wherein i is an integer;
  (b) predetermining a series of azimuthal multiplexing angles $\{\phi_j\}$, wherein j is an integer;
  (c) selecting a pair of angles $(\theta_a, \phi_b)$ wherein a and b are integers and $\theta_a$ and $\phi_b$ are independently selected from the series $\{\theta_i\}$ and $\{\phi_j\}$, respectively;
  (d) directing an object beam and a reference beam that are mutually coherent at a data storage location situated along a selected track on the optical recording media,
    wherein the reference beam is reflected from at least one aspherical reflecting surface having two focal points, said at least one aspherical reflecting surface having portions that correspond to azimuthal angles spanning an azimuthal arc of 360°, and
    wherein an angle between portions of the object beam and the reference beam impinging onto a recording media is $\theta_a$, and
    wherein the portion of the reference beam impinging onto the recording media has an azimuthal angle $\phi_b$ about an axis that lies in the plane formed by optical axes of portions of the object beam and the reference beam impinging on the recording media at or near one of the two focal points.

28. The method of claim 27 further including the steps of:
  (e) repeating step (d) for a plurality of data storage locations along a selected track, thereby recording a plurality of holograms, each at a storage location along the selected track on the optical recording media; and
  (f) repeating steps (c) through (e) for different integers a and/or b, wherein
  the subsequent holograms are recorded along the selected track using the storage locations utilized by the previously recorded plurality holograms.

29. The method of claim 28 further including repeating steps (a) through (f), wherein a different track on the optical recording media is selected.

30. The method of claim 28 wherein the data storage locations along a track are non-overlapping and substantially abutting.

31. The method of claim 27 further including the steps of:
  (e) repeating step (d) for different integers a and/or b for the same storage location on a selected track thereby recording a plurality of holograms, each at the same storage location along the selected track on the optical recording media;
  (f) repeating steps (c) through (e) for different storage locations along the selected track.

32. The method of claim 31 further including repeating steps (a) through (f), wherein a different track on the optical recording media is selected.

33. The method of claim 31 wherein the data storage locations along a track are non-overlapping and substantially abutting.

34. The method of claim 27 wherein the optical recording media is a disk or card.

35. The method of claim 27 wherein the at least one aspherical reflecting surface is a portion of an ellipsoidal mirror.

36. The method of claim 27 further including a step of reflecting the reference beam from at least one additional reflecting surface.

37. The method of claim 36 wherein the additional reflecting surface is at least partially rotatable with respect to a first axis and, independently, a second axes.

38. The method of claim 37 further including the steps of:
  at least partially rotating the additional reflecting surface through a series of selected angles about the first axis, thereby changing an angle between the portion of the object beam and the portion of the reference beam impinging onto a recording media through the series of planar-angle multiplexing angles $\{\theta_i\}$; and
  at least partially rotating the additional reflecting surface through a series of selected angles about the second axis perpendicular to the first axis, thereby rotating the portion of the reference beam impinging on the recording media through the series of azimuthal multiplexing angles $\{\phi_j\}$ about an axis that lies in the plane formed by optical axes of portions of the object beam and the reference beam impinging on the recording media, while preserving the angle between said portions of the object beam and the reference beam impinging on the recording media.

39. The method of claim 38 wherein said additional reflecting surface and the recording media are disposed on the same side of any plane that is (a) parallel to a surface of the recording media and (b) intersects the ellipsoidal reflecting surface.

40. The method of claim 39 wherein a portion of the reference beam impinging on the additional reflecting surface is coaxial with an axis formed by the two foci of the ellipsoidal reflecting surface.

41. The method of claim 39 wherein a portion of the reference beam impinging on the additional reflecting surface is not coaxial with an axis formed by the two foci of the ellipsoidal reflecting surface.

42. The method of claim 38 wherein said additional reflecting surface and the recording media are disposed on different sides of any plane that is (a) parallel to a surface of the recording media and (b) intersects the ellipsoidal reflecting surface.

43. The method of claim 38 wherein the step of directing the reference beam further includes:
  directing the reference beam reflected from the additional reflecting surface to a second additional reflecting surface; and
  reflecting the reference beam from said second additional reflecting surface.

44. The method of claim 38 wherein the step of directing the reference beam further includes:
  directing the reference beam reflected from the ellipsoidal reflecting surface to a second aspherical reflecting surface; and
  reflecting said reference beam from the second aspherical reflecting surface.

45. The method of claim 37 wherein the additional reflecting surface is a planar mirror.

46. The method of claim 37 wherein the additional reflecting surface is a curved reflecting surface.

47. The method of claim 37 wherein the additional reflecting surface is an aspherical surface.

48. A method of reading azimuthally and angularly multiplexed holograms recorded in an optical recording media, comprising the steps of:
  (a) predetermining at least one selected multiplexed hologram of a selected storage location along a selected track of recorded storage locations in an optical recording media;

(b) predetermining at least one of a plurality of azimuthal multiplexing angles $\{\phi_j\}$, wherein j is an integer, used to record said selected multiplexed hologram;

(c) selecting a $\phi_a$ wherein a is an integer $\phi_a$ is selected from the series $\{\phi_j\}$;

(d) directing a reference beam at the selected data storage location, wherein the reference beam is reflected from at least one aspherical reflecting surface having two focal points, said at least one aspherical reflecting surface having portions that correspond to azimuthal angles spanning an azimuthal arc of 360°, and wherein the portion of the reference beam impinges onto the recording media at or near one of the two focal points and has an azimuthal angle $\phi_a$ about an axis that lies in the plane formed by optical axes of portions of the object beam and the reference beam impinging on the recording media and used to record said selected multiplexed hologram, and wherein reconstructing the selected multiplexed hologram includes relaying a diffraction pattern from the multiplexed hologram with reconstruction optics to a detector; and (e) repeating step (d) for a plurality of selected multiplexed holograms previously recorded in data storage locations along at least one selected track for different integer a as may be necessary to read other selected multiplexed holograms, thereby reading a plurality of selected multiplexed holograms, each at a selected storage location along at least one track on the optical recording media.

49. A method of reading azimuthally and angularly multiplexed holograms recorded in an optical recording media, comprising the steps of:

(a) predetermining at least one selected multiplexed hologram of a selected storage location along a selected track of recorded storage locations in an optical recording media;

(b) predetermining at least one of a plurality of planar-angle multiplexing angles $\{\theta_i\}$, wherein i is an integer, used to record said selected multiplexed hologram;

(c) predetermining at least one of a plurality of azimuthal multiplexing angles $\{\phi_j\}$, wherein j is an integer, used to record said selected multiplexed hologram;

(d) selecting a pair of angles $(\theta_a, \theta_b)$ wherein a and b are integers and $\theta_a$ and $\phi_b$ are selected from the series $\{\theta_i\}$ and $\{\phi_j\}$, respectively;

(e) directing a reference beam at the selected data storage location, wherein the reference beam is reflected from at least one aspherical reflecting surface having two focal points, said at least one aspherical reflecting surface having portions that correspond to azimuthal angles spanning an azimuthal arc of 360°, and wherein a portion of the reference beam impinges on the selected storage location at or near one of the two focal points;

wherein the angle between the portion of the reference beam that impinges on a recording media at the selected storage location and a portion of an object beam used to record said selected multiplexed hologram that impinged on the recording media at said selected storage location is $\theta_a$, and wherein the portion of the reference beam impinging onto the recording media has an azimuthal angle $\phi_b$ about an axis that lies in the plane formed by optical axes of portions of the object beam and the reference beam impinging on the recording media and used to record said selected multiplexed hologram, and wherein reconstructing of the selected multiplexed hologram includes relaying a diffraction pattern from the multiplexed hologram with reconstruction optics to a detector; and (f) repeating step (e) for a plurality of selected multiplexed holograms previously recorded in data storage locations along at least one selected track for different integers a and/or b as may be necessary to read other selected multiplexed holograms, thereby reading a plurality of selected multiplexed holograms, each at a selected storage location along at least one track on the optical recording media.

50. An apparatus for recording holographically stored information comprising:

at least one aspherical reflecting surface having two focal points, said at least one aspherical reflecting surface having portions that correspond to azimuthal angles spanning an azimuthal arc of 360°;

at least one additional reflecting surface;

a motive device for rotating at least one of either the at least one aspherical reflecting surface or the at least one additional reflecting surface about a first axis and, independently, a second axis, perpendicular to the first axis; and means for directing an object beam and a reference beam that are mutually coherent along their respective optical paths, wherein either the object beam or the reference beam is reflected from the aspherical reflecting surface to intersect and form an interference pattern with the reference beam or the object beam at a storage location in a recording media at or near one of the two focal points.

51. The apparatus of claim 50 wherein at least one portion of the at least one aspherical reflecting surface is an ellipsoidal reflecting surface.

52. The apparatus of claim 51 wherein said additional reflecting surface and the recording media are disposed on the same side of any plane that is (a) parallel to a surface of the recording media and (b) intersects the at least one aspherical reflecting surface.

53. The apparatus of claim 52 wherein a portion of the reference beam impinging on the additional reflecting surface is coaxial with an axis formed by two foci of the at least one aspherical reflecting surface.

54. The apparatus of claim 52 wherein a portion of the reference beam impinging on the additional reflecting surface is not coaxial with an axis formed by two foci of the at least one aspherical reflecting surface.

55. The apparatus of claim 50 wherein the motive device for rotating the additional reflecting surface is a two-dimensional galvanometer.

56. The apparatus of claim 50 wherein the motive device for rotating the additional reflecting surface is a MEMS device.

57. The apparatus of claim 50 wherein the motive device for rotating the additional reflecting surface includes two independently controlled one-dimensional galvanometers.

58. The apparatus of claim 50 wherein the motive device for rotating the additional reflecting surface is a one-dimensional galvanometer mounted on a rotary motive device.

59. The apparatus of claim 50 wherein a first focus of the at least one aspherical reflecting surface is located on at least one additional reflecting surface; and a second focus of the at least one aspherical reflecting surface is located at or near a surface of or within the recording media.

60. The apparatus of claim 59 wherein
either the object beam or the reference beam is directed to the at least one aspherical reflecting surface by reflecting either the object beam or the reference beam from the additional reflecting surface, and
wherein said additional reflecting surface can be rotated about at least one axis to effect redirection of one of said object or reference beams through an azimuthal arc of any angle between 0° and 45° on said at least one aspherical reflecting surface.

61. The apparatus of claim 59 wherein
either the object beam or the reference beam is directed to the at least one aspherical reflecting surface by reflecting either the object beam or the reference beam from the additional reflecting surface, and
said additional reflecting surface can be rotated about at least one axis to effect redirection of one of said object or reference beams through an azimuthal arc of any angle between 0° and 90° on said at least one aspherical reflecting surface.

62. The apparatus of claim 59 wherein
either the object beam or the reference beam is directed to the at least one aspherical reflecting surface by reflecting either the object beam or the reference beam from the additional reflecting surface, and
said additional reflecting surface can be rotated about at least one axis to effect redirection of one of said object or reference beams through an azimuthal arc of at least 90° and less than or equal to 180° on said at least one aspherical reflecting surface.

63. The apparatus of claim 59 wherein
either the object beam or the reference beam is directed to the at least one aspherical reflecting surface by reflecting either the object beam or the reference beam from the additional reflecting surface, and
said additional reflecting surface can be rotated about at least one axis to effect redirection of one of said object or reference beams through an azimuthal arc of at least 90° and less than or equal to 270° on said at least one aspherical reflecting surface.

64. The apparatus of claim 59 wherein
either the object beam or the reference beam is directed to the at least one aspherical reflecting surface by reflecting either the object beam or the reference beam from the additional reflecting surface, and
said additional reflecting surface can be rotated about at least one axis to effect redirection of one of said object or reference beams through an azimuthal arc of at least 90° and less than or equal to 360° on said at least one aspherical reflecting surface.

65. The apparatus of claim 59 wherein
either the object beam or the reference beam is directed to the at least one aspherical reflecting surface by reflecting either the object beam or the reference beam from the additional reflecting surface, and
said additional reflecting surface can be rotated about at least one axis to effect redirection of one of said object or reference beams through an azimuthal arc of at least 180° and less than or equal to 360° on said at least one aspherical reflecting surface.

66. The apparatus of claim 59 wherein
either the object beam or the reference beam is directed to the at least one aspherical reflecting surface by reflecting either the object beam or the reference beam from the additional reflecting surface, and
wherein said additional reflecting surface can be rotated about at least one axis to effect redirection of one of said object or reference beams through an azimuthal arc on said at least one aspherical reflecting surface.

67. The apparatus of claim 50 wherein the additional reflecting surface is a planar mirror.

68. The apparatus of claim 50 wherein the additional reflecting surface is a curved reflecting surface.

69. The apparatus of claim 50 wherein the additional reflecting surface is an aspherical surface.

70. The apparatus of claim 50 wherein said additional reflecting surface and the recording media are disposed on different sides of any plane that is (a) parallel to a surface of the recording media and (b) intersects the first at least one aspherical reflecting surface.

71. The apparatus of claim 50 further including a second additional reflecting surface, wherein the reference beam reflected from the additional reflecting surface is directed to the second additional reflecting surface.

72. The apparatus of claim 71, wherein the second reflecting surface is a second aspherical reflecting surface, and
wherein the reference beam reflected from the at least one aspherical reflecting surface is directed to the second aspherical reflecting surface.

73. The apparatus of claim 50, further including a recording media.

74. The apparatus of claim 73, wherein at least one of a portion of the object beam or the reference beam forming an interference pattern with the one another at said selected storage location can be rotated through a selected azimuthal angle about an axis that lies in the plane formed by optical axes of said portions of the object beam and the reference beam impinging on the recording media, wherein said axis passes through the selected storage location.

75. The apparatus of claim 74, wherein data storage locations are situated along at least one track on the optical recording media, said data storage locations being either non-overlapping and substantially abutting or overlapping.

76. The apparatus of claim 50, wherein the at least one aspherical reflecting surface is a segmented surface comprising a group of mirrors.

77. The apparatus of claim 50, wherein the additional reflecting surface is located at or near one of the foci of the aspherical reflecting surface.

78. An apparatus for reading and/or recording of holographically stored information comprising:
at least one aspherical reflecting surface having two focal points, said at least one aspherical reflecting surface having portions that correspond to azimuthal angles spanning an azimuthal arc of 360°;
at least one additional reflecting surface;
reconstruction optics for reconstructing at least one selected hologram;
a detector for detecting the selected reconstructed hologram;
a motive device for rotating at least one of either the at least one
aspherical reflecting surface or the at least one additional reflecting surface about a first axis and, independently, a second axis, perpendicular to the first axis; and
a means for directing a reference beam along its optical path, wherein a reference beam is reflected from the at least one aspherical reflecting surface to impinge on at least one selected storage location in a recording media at or near one of the two focal points.

79. The apparatus of claim 78 wherein reconstructing the selected multiplexed hologram includes relaying a diffraction pattern from the selected multiplexed hologram with reconstruction optics to a detector.

80. The apparatus of claim 78 further including means for directing an object beam and the reference beam that are mutually coherent along their respective optical paths.

81. The apparatus of claim 80 wherein either the object beam or the reference beam is reflected from the at least one aspherical reflecting surface to intersect and form an interference pattern with the other at a storage location in the recording media.

82. The apparatus of claim 78, further including an optical recording media.

83. The apparatus of claim 82, wherein at least one of a portion of the object beam or the reference beam forming an interference pattern with the one another at said selected storage location can be rotated through a selected azimuthal angle about an axis that lies in the plane formed by optical axes of said portions of the object beam and the reference beam impinging on the recording media, wherein said axis passes through the selected storage location.

84. The apparatus of claim 83, wherein data storage locations are situated along at least one track on the optical recording media, said data storage locations being either non-overlapping and substantially abutting or overlapping.

* * * * *